United States Patent
Yudanov

(10) Patent No.: US 11,276,463 B2
(45) Date of Patent: Mar. 15, 2022

(54) MATCHING PATTERNS IN MEMORY ARRAYS

(71) Applicant: Micron Technology, Inc., Boise, ID (US)

(72) Inventor: Dmitri Yudanov, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/902,685

(22) Filed: Jun. 16, 2020

(65) Prior Publication Data

US 2021/0391004 A1 Dec. 16, 2021

(51) Int. Cl.
*G11C 16/04* (2006.01)
*G11C 13/00* (2006.01)
*G06F 16/2458* (2019.01)
*G06N 3/04* (2006.01)

(52) U.S. Cl.
CPC ........ *G11C 13/004* (2013.01); *G06F 16/2468* (2019.01); *G11C 13/0026* (2013.01); *G06N 3/04* (2013.01)

(58) Field of Classification Search
CPC .............. G11C 13/004; G11C 13/0026; G06F 16/2468
See application file for complete search history.

(56) References Cited

U.S. PATENT DOCUMENTS

| | | | |
|---|---|---|---|
| 7,362,633 B2 * | 4/2008 | Fekih-Romdhane | G11C 29/26 365/189.07 |
| 7,872,931 B2 * | 1/2011 | Fekih-Romdhane | G11C 29/028 365/201 |
| 8,463,988 B2 | 6/2013 | Kim et al. | |
| 9,627,091 B1 * | 4/2017 | Chan | G11C 29/025 |
| 9,679,621 B2 * | 6/2017 | Park | G11C 7/02 |
| 2012/0131399 A1 | 5/2012 | Henrion et al. | |
| 2014/0133228 A1 | 5/2014 | Sprouse et al. | |
| 2016/0259724 A1 | 9/2016 | Steele, Jr. et al. | |
| 2018/0226127 A1 | 8/2018 | Manning | |

OTHER PUBLICATIONS

International Search Report and Written Opinion, PCT/US2021/036805, dated Oct. 8, 2021.

* cited by examiner

*Primary Examiner* — Pho M Luu
(74) *Attorney, Agent, or Firm* — Greenberg Traurig

(57) ABSTRACT

Systems and methods for performing a pattern matching operation in a memory device are disclosed. The memory device may include a controller and memory arrays where the memory arrays store different patterns along bit lines. An input pattern is applied to the memory array(s) to determine whether the pattern is stored in the memory device. Word lines may be activated in series or in parallel to search for patterns within the memory array. The memory array may include memory cells that store binary digits, discrete values or analog values.

22 Claims, 12 Drawing Sheets

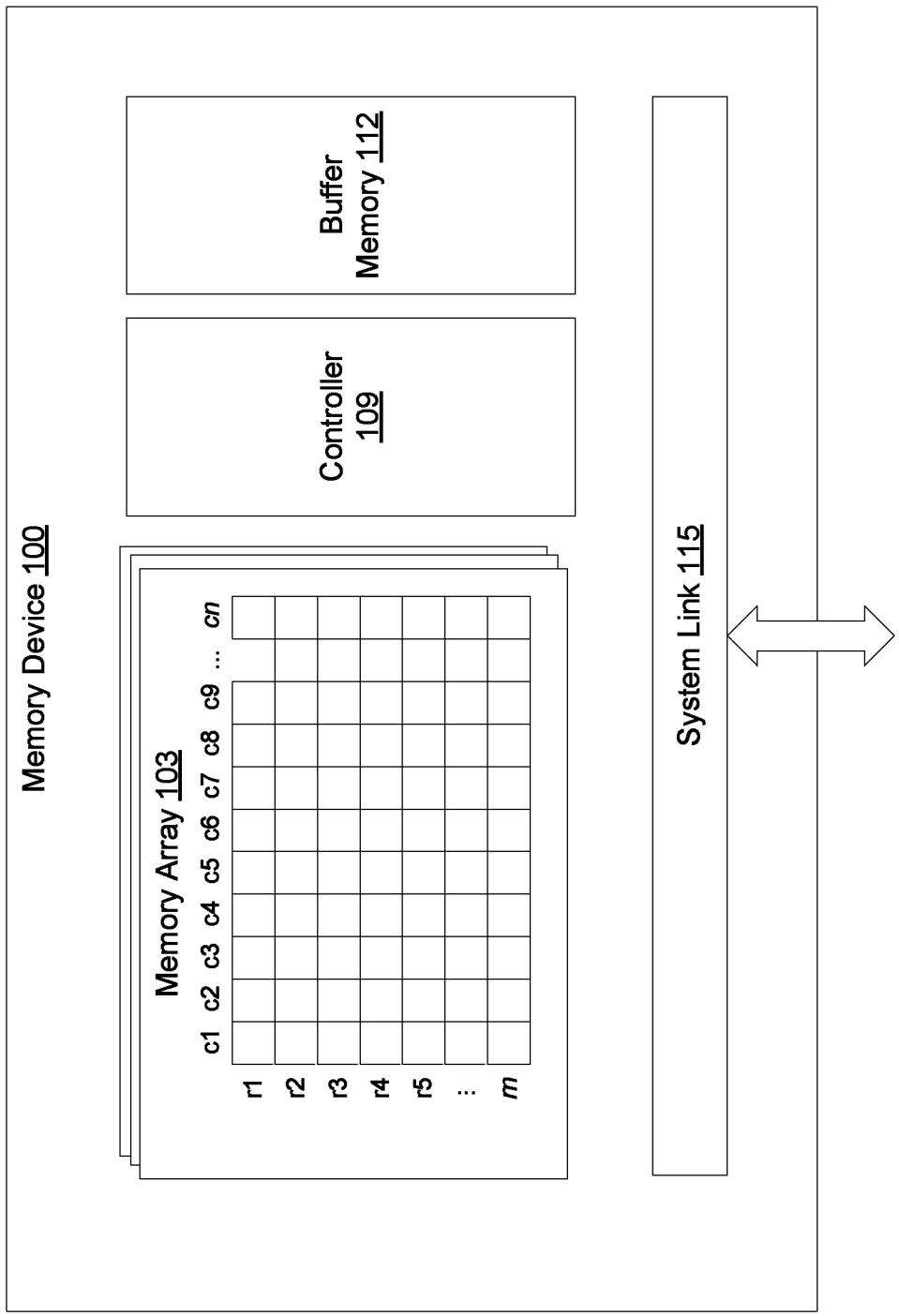

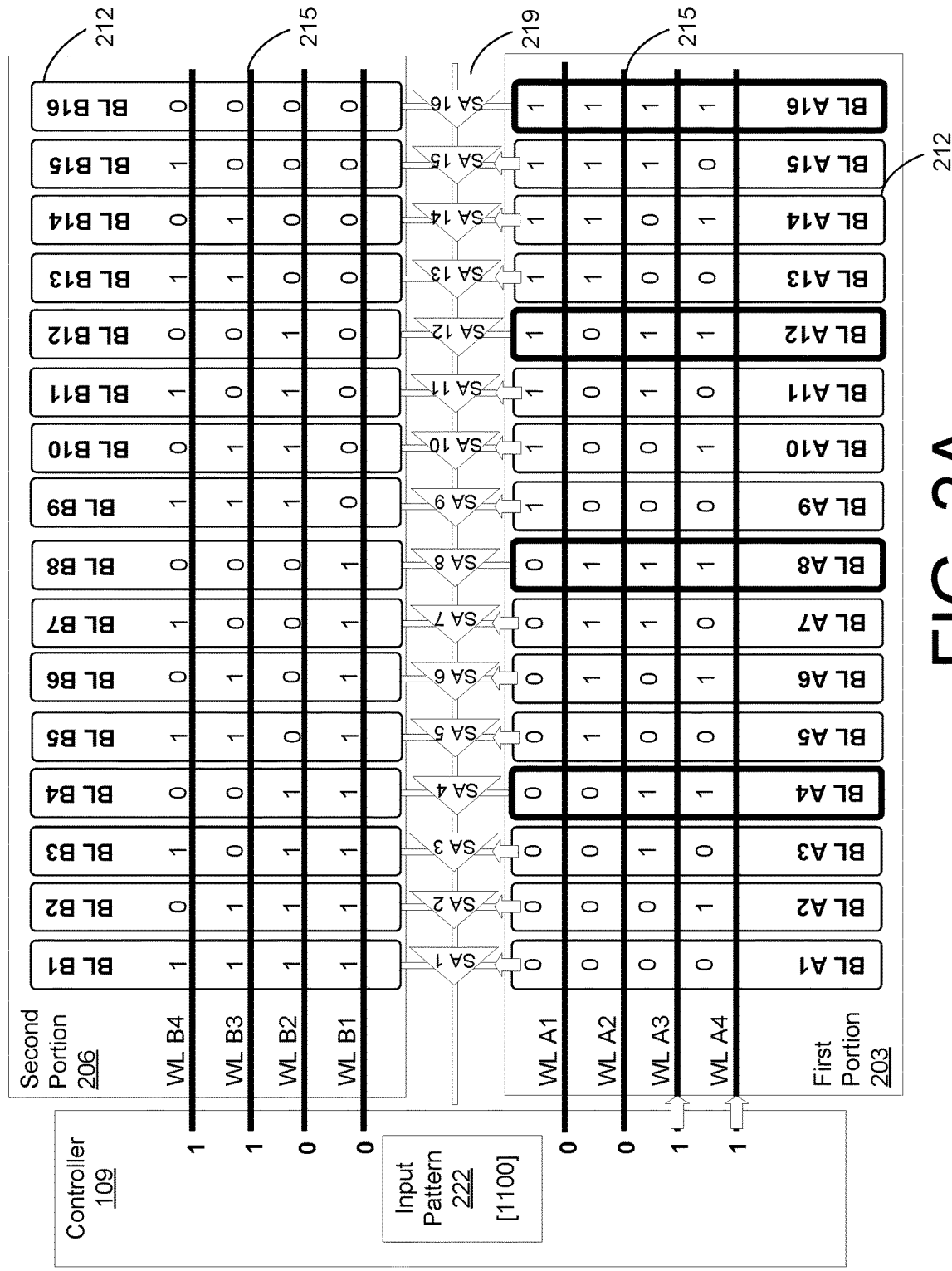

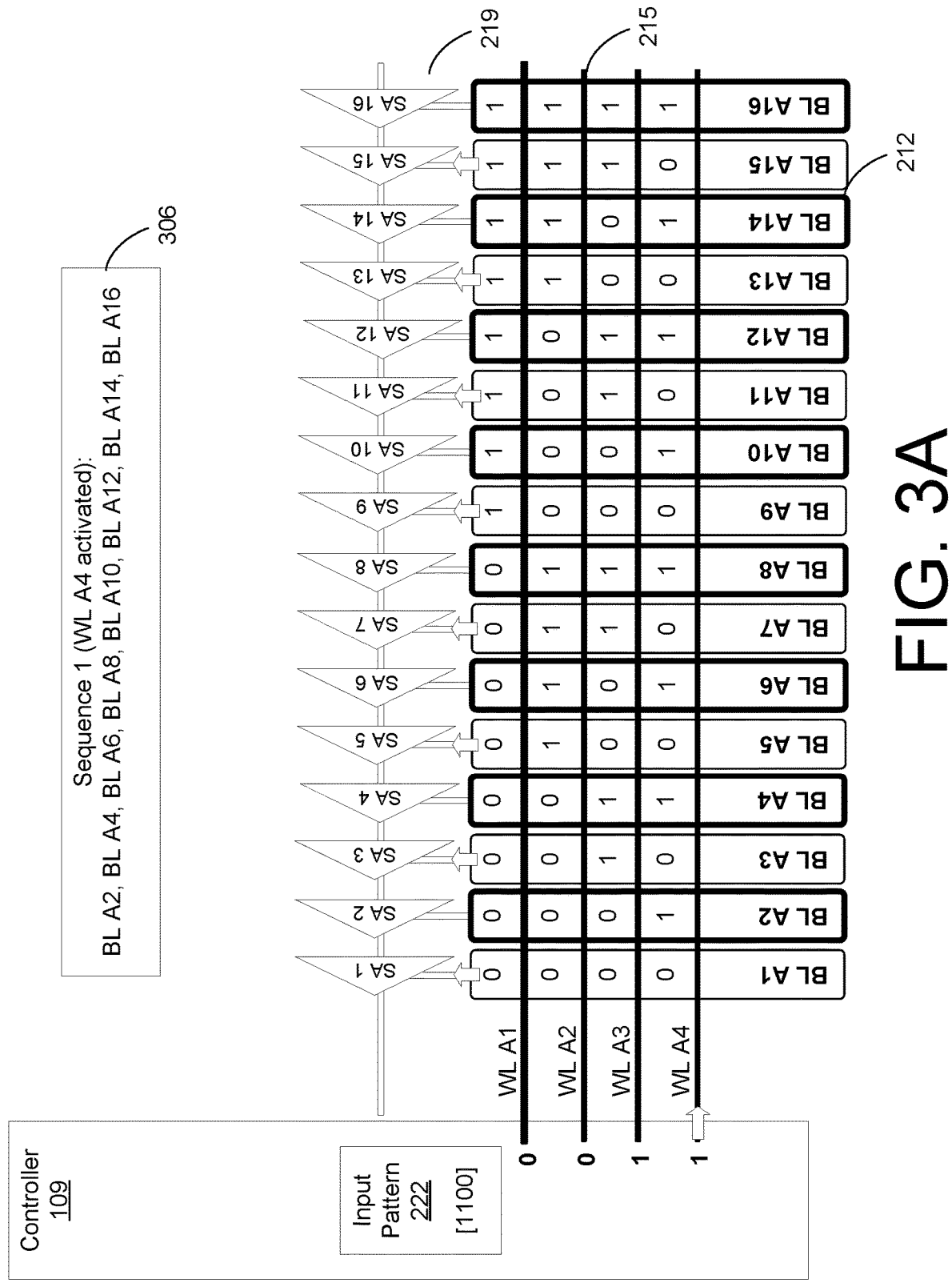

MATCHING PATTERNS IN MEMORY ARRAYS

BACKGROUND

Memory devices are made up of different memory arrays, where a memory array is further made up of individual memory cells. Data is stored in memory cells. A memory cell may be accessed by activating word lines and bit lines to reading out the values stored in the memory cell. Memory cells may also store values by writing values to the memory cells. A generic processor may be coupled to the memory device and configured to perform read and write operations to process data stored in the memory device.

BRIEF DESCRIPTION OF THE DRAWINGS

Many aspects of the present disclosure can be better understood with reference to the attached drawings. The components in the drawings are not necessarily drawn to scale, with emphasis instead being placed upon clearly illustrating the principles of the disclosure. Moreover, in the drawings, like reference numerals designate corresponding parts throughout several views.

FIG. 1 is a drawing of a memory device that performs pattern matching according to various embodiments.

FIGS. 2A-B are drawings of a memory device configured to perform pattern matching by activating word lines in parallel according to various embodiments.

FIGS. 3A-D are drawings of a memory device configured to perform pattern matching by activating word lines in series according to various embodiments.

DETAILED DESCRIPTION

Figure 2B:
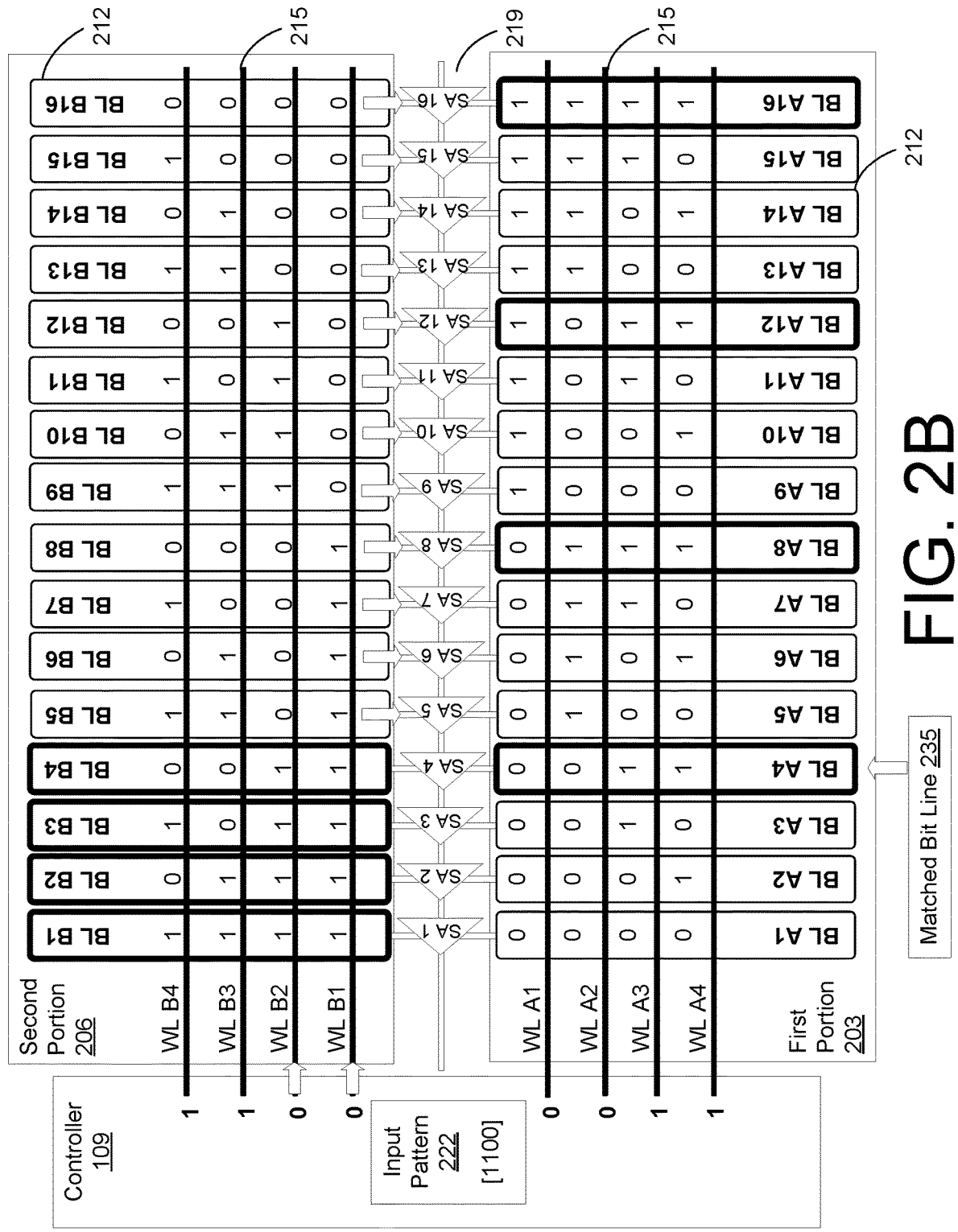

The present disclosure is directed to performing pattern matching in a memory device. Rather than relying on a generic computer processer (e.g., a host process) to perform operations and manage the storage of data, a memory device that includes a controller and memory arrays store patterns and match input patterns to stored patterns. By configuring the memory device to perform these operations, as described in various embodiments herein, processing time and resources may be reduced when compared to conventional approaches.

Pattern matching is the fundamental basis for searching data, and searching data is a key operation for a plethora of applications. There may be many high-level applications that can use pattern matching. For example, neural network-based operations, convolutional operations, key-value pair lookup operations, database searches, search engines, content-addressable memories (CAMs) are just a few examples that may use pattern matching. In a pattern matching operation, an input pattern is received. The input pattern may be a series of values (e.g., binary values, discrete values, analog values). The result of the operation is whether the pattern is stored in memory and/or where the pattern is stored in memory.

FIG. 1 is a drawing of a memory device 100 that performs pattern matching according to various embodiments. A memory device 100 is an integrated circuit. The memory device 100 may be a semiconductor chip or die or a die stack. The memory device 100 may include one or more memory arrays 103. A memory array 103 comprises a plurality of rows and columns and may be defined in terms of a row-column size. The example of FIG. 1 shows a memory array 103 having rows labeled r1-rn and columns c1-cn. At each row and column intersection is a memory cell configured to store a value. For example, a data array may contain four elements as follows: [A, B, C, D] where the first element is A, the second element is B, the third element is C, and the fourth element is D. The data array [A, B, C, D] may be stored in the memory array 103 such that each element of the data array is stored in a corresponding memory cell. For example, element A may be stored in cell (r1, c1), element B may be stored in cell (r1, c2), element C may be stored in cell (r1, c3), and element D may be stored in cell (r1, c4). Thus, in this example, the data array [A, B, C, D] is stored along the first row and occupies the first four columns. This is referred to as a "bit-parallel" configuration. As another example, the data array [A, B, C, D] may be stored along the first column occupying the first four rows. Here, element A may be stored in cell (r1, c1), element B may be stored in cell (r2, c1), element C may be stored in cell (r3, c1), and element D may be stored in cell (r4, c1). This is referred to as a "bit-serial" configuration. Each element [A, B, C, D] may be a binary digit (e.g., a zero or a 1, or a high value and a low value), a discrete value (e.g., a quantized value, a finite number, an integer), or an analog value (e.g., a continuous number, an irrational number). Thus, the memory array 103 is a hardware component used to store data as a plurality of array elements addressable by rows and columns.

In addition to pure bit-parallel and pure bit-serial ways of storing a data array [A, B, C, D], the data array may also be stored in a hybrid way. For example, elements A and B can be stored in a first row and elements C and D can be stored in a second row such that A and C are stored on the first column, but C and D are stored on a second column. Thus, A is aligned with B, row-wise, and C is aligned with D, row-wise. However, A is aligned with C, column-wise, and is B is aligned with D, column-wise. Besides, A and C do not need to be adjoining row-wise, and B and D do not need to be adjoining row-wise. Also, A and C do not need to be adjoining column-wise, and B and D do not need to be adjoining column-wise. Thus, in various embodiments, combinations of bit-serial and bit-parallel arrangements are contemplated.

According to embodiments, the memory device 100 may be a Resistive Random Access Memory (ReRAM), 3D Cross Point (3DXP), or other memory devices that implement resistive memory cells or rather memory cells that can offer to flex or modulate their conductance. Such cells can be diodes, transistors including floating gain and replacement gate transistors, etc. For example, resistive memory cells store data by modulating the resistance of the memory cell according to the data it stores. If a resistive memory cell stores a binary zero ("0"), the resistance may be set to a low value so that the memory cell forms a short circuit (e.g., a resistive short). The memory cell stores a binary one ("1"), the resistance may be set to a high value so that the memory cell forms an open circuit (e.g., a resistive open). The resistance may also be set to be intermediate resistances to store discrete values (e.g., quantized values). The resistance may also be set to be within a range of resistances to store analog values. Memory cells may also include asymmetric elements such as diodes where current passes in one direct but is otherwise impeded in the opposite direction. Other asymmetric elements that may serve as memory cells include, for example, transistors and magnetic tunnel junctions (MTJs).

The memory device may include a controller 109, a buffer memory 112, a system link 115, and potentially other integrated components. The controller 109 may be a special-purpose processor or other component that implements logic that is executed by the memory device. The controller 109 may comprise integrated circuitry dedicated to store data in the memory array 103 by organizing the data according into different patterns.

In some embodiments, the controller 109 may be implemented as a separate device that couples to the memory device 100. For example, the controller 109 may be implemented in an Application-Specific Integrated Circuit (ASIC), Field Programmable Gate Array (FPGA), or other special purpose processor. The controller may thus be part of a host device that couples to the memory device 100.

In addition, the controller 109 may receive input (e.g., an input pattern), and perform pattern matching operations to determine if the input pattern matches a pattern stored in the memory device 100. The controller 109 may include microcode that controls which word lines and bit lines are activated and in what sequence. Word lines and bit lines are activated by applying a voltage or supplying a current to selected word lines and bit lines. The may be referred to as an activation signal. In some embodiments, the controller 109 may adjust the strength of the activation signal by varying the voltage or current depending on the application.

The memory device 100 may also include a buffer memory 112. The buffer memory 112 may be included as part of the controller 109 and or it may be external to the controller 109. The buffer memory 112 may be connected to the controller 109 via an internal bus. Alternatively, the buffer memory 112 can be a part of a memory array 103 that is allocated specifically for buffer purposes described herein. In this respect, one memory array 103 may serve as buffer memory for other memory arrays 103. The controller 109 may write to or read from the buffer memory 112. For example, the buffer memory 112 may be used to store intermediate data or intermediate results while the memory array 103 is used to process data.

The memory device 100 may also include a system link 115. The system link may provide data and/or control signals between the memory device 100 and external systems. The system link 115 may couple to various components of the memory device 100 such as, for example, the memory array 103, the controller 109, the buffer memory 112, and other components. Thus, system link 115 may internally link various components of memory device 100 that allow these components to exchange data and/or control signals among each other. The system link 115 may comprise input/output ports to couple to external systems outside the memory device 100. The system link 115 may be an Input/Output (10) bus such as, for example, a DDR5 bus or PCIe bus. In this respect, an external system may read or write data to the memory array 103 and buffer memory 112. In addition, external systems may transmit control signals to the controller 109 to program or otherwise control the controller 109.

An external system may include a host processor with a PCB motherboard, wherein the memory device 100 is connected to host processor over a bus such as DDR4, DDR5 or PCIe or the like. The external system may execute an operating system, applications, libraries, scripts, or programming languages. The external system may include one or more server racks or computers or other arrangements. A server may be a single installation or may be distributed among many different geographical locations. The external system may include a plurality of computing devices that together may comprise a hosted computing resource, a grid computing resource and/or any other distributed computing arrangement. In some cases, the external system may correspond to an elastic computing resource where the allotted capacity of processing, network, storage, or other computing-related resources may vary over time. The external system may implement one or more virtual machines that use the resources of the computing system. Various software components may be executed on one or more virtual machines. The external system may also include additional memory devices. In this respect, an instance of a memory device 100 may query, control or access data in any additional memory devices 100 installed in a system.

The system link 115 may allow the memory device 100 to couple to external systems that together combined or separately implement a convolutional neural network or perform other convolutional operations. For example, the memory device 100 may implement a layer within a neural network or multiple layers within a neural network. For example, the memory device 100 may be used to implement a convolution layer. The system link 115 may extract outputs of a memory device 100 and input them into different layers of the neural network located in other memory devices or other parts of external system. A pooling layer in a neural network may obtain outputs from the system link 115 of a memory device 100, may perform pooling operations, and may pass the result as inputs into the memory device 100. For example, the output data generated by the memory device 100 may be accessed by the system link 115 and processed externally by a pooling layer, where those results are supplied to the memory array 103 of the memory device 100 via the system link 115 for additional processing. While FIG. 1 provides explanation of the overall architecture, the remaining FIGS., discussed below, provide more specific examples of how data is processed in a memory device 100 according to various embodiments.

FIGS. 2A-B are drawings of a memory device 100 configured to perform pattern matching by activating word lines in parallel according to various embodiments. FIGS. 2A-B show a first portion 203 of the memory device 100 storing a first set of patterns and a second portion 206 of the memory device 100 storing a second set of patterns. A portion 203, 206 of the memory device 100, may span one or more memory arrays 103. For example, the first portion 203 may be a portion of a first memory array 103 and the second portion 206 may be a portion of a second memory array. Alternatively, the first and second portions 203, 206, may be part of the same memory array 103.

The second set of patterns are inverted with respect to the patterns of the first set. For example, a first pattern in the first portion 203 may have a corresponding version in the second portion 206, where the corresponding version is inverted with respect to the first pattern. An inverted pattern (e.g., an anti-pattern), has each bit inverted with respect to the original pattern. For example, the pattern [0100] has an inverted pattern of [1011]. If bits are multi-state, then their respective multi-state values are inverted (e.g. a quad-state bit (the bit that has 4 states that can encode 2-bit binary value) that stores binary "01" is inverted as to its state corresponding to binary value "10").

The memory device 100 includes bit lines 212 and word lines 215. Each portion 203, 206 contains memory cells accessible by a corresponding bit line 212 and a corresponding word line 215. An activation signal may select a bit line 212 and a word line 215 to access a single memory cell. In addition, an activation signal may be applied to multiple bit lines 212 and/or multiple word lines 215 to access a plurality of memory cells in parallel.

The memory device 100 also includes an array of sense amplifiers 219. Each sense amplifier 219 in the array can be reconfigured to coupe to different bit lines 212 of the memory device. The controller 109 may reconfigure the sense amplifiers to control how they are coupled to corresponding bit lines 212. A sense amplifier may couple to one or more bit lines 212 and may further couple to different bit lines 212 of different memory arrays 103. In one embodiment, the array of sense amplifiers couple to both the first portion 203 and the second portion 206.

The memory device 100 may receive an input pattern 222 and determine if the input pattern is stored in the memory device. In addition, the memory device 100 may identify the location of where the input pattern is being stored by identifying a bit line 212 and potentially the word lines 215 that correspond to the memory location of the pattern. The memory device 100 may further access other locations that are associated with identified location. For example, access values may be based on an identified key (key-value lookup).

For example, the controller 109 may be configured to apply an input pattern 222 to the first portion 203 and to the second portion 206 of the memory device 100. The array of sense amplifiers 219 may identify a of bit line 212 that stores a pattern that substantially matches the input pattern 222 in the first portion 203 or in the second portion 206 of the memory device 100.

To illustrate, FIG. 2A shows a first sequence for pattern matching and FIG. 2B shows a second sequence to complete the pattern matching. To store the first set of patterns, each pattern in the first set of patterns may be stored in a bit-serial orientation, where each pattern is stored along a bit line 212. In this example, the pattern is four bits long. Bit line BL A1 stores a first pattern MSB=>[0, 0, 0, 0]<=LSB, bit line BL A2 stores a second pattern MSB=>[1, 0, 0, 0]<=LSB, and so on. While FIG. 2A shows the storage of 16 unique, four-bit patterns, any number of patterns may be stored. In addition, duplicate patterns may be stored. Longer than 4-bit long patterns can be stored. Patterns can be stored in any order. The patterns stored in the memory device are stored prior to performing pattern matching. In this respect, the patterns may be considered as target patterns that may be matched to an input pattern 222.

A set of inverse patterns are stored in a different portion of memory, such as the second portion of memory 206. The inverse of the pattern stored at bit line BL A1 is MSB=>[1, 1, 1, 1]<=LSB and it is stored along bit line BL B1. The inverse of the pattern stored at bit line BL A2 is MSB=>[0, 1, 1, 1]<=LSB and it is stored along bit line BL B2, and so on. Thus, the number patterns in the first portion 203 may be the same as the number of patterns in the second portion 206, as the second portion stores the inverse version of each pattern in the first portion 203. In other embodiments, both a pattern and its inverse pattern are stored along the same bit line 212 and having consistent MSB to LSB direction. The direction itself does not matter as long as it adheres to the same order for both patterns and inverse patterns.

As shown in the example of FIG. 2A, a pattern and its corresponding inverse pattern are coupled to the same sense amplifier 219. For example, sense amplifier SA 1 couples to the BL A1 and BL B1, sense amplifier SA 2 couples to BL A2 and BL B2, and so on. They can be coupled to different sense amplifiers, but their correlation (location of pattern and associated location of inverse pattern) is important as discussed in greater detail below.

Each pattern includes several bits, each bit accessible via a different word line 215. For example, WL A1 accesses the least significant bit (LSB) of a pattern while WL A4 accesses the most significant bit (MSB) of a pattern. For the inverse patterns stored in the second portion 206, WL B1 accesses the LSB of a pattern while WL B4 accesses the MSB of a pattern.

In the first sequence shown in FIG. 2A the first set of patterns stored in the first portion 203 are accessed first as part of the pattern matching operation. An input pattern 222 is received by the controller, where, in this example, the input pattern 222 is [1, 1, 0, 0], starting with the MSB. The memory device 100 is configured to determine whether this input pattern is stored in the memory device 100 and where it is stored. As shown in FIG. 2A, the input pattern 222 is stored in BL A4. The following example explains how this determination is made.

In the first sequence, the controller 109 applies an activation signal (e.g., a current or voltage or frequency or duty cycle or similar signal) to the specific word lines 215 of the first portion 203. The strength of the activation signal in this embodiment may be a predetermined, fixed value. The word lines 215 that receive the activation signal are the word lines 215 that correspond to a binary one when mapping the word lines 215 to the input pattern 222. For example, the input pattern 222 [1, 1, 0, 0] is applied to word lines WL A4-WL A1 (starting with the MSB). Thus, WL A4 and WL A3 corresponding to binary ones while WL A2 and WL A1 correspond to binary zeros. WL A4 and WL A3 are there for activated by an activation signal based on the values of the input pattern 222. Next, the sense amplifier 219 receives a signal at each bit line 222 to which it is coupled. This may be referred to as a sense amplifier signal. The sense amplifier signal may be a voltage or a current. A strong sense amplifier signal indicates a resistive short while a weak sense amplifier signal indicates a resistive open. If a memory cell stores a binary zero, it may be set to a resistive short state where current easily flows across the memory cell. The sense amplifier 219 would detect this as a strong sense amplifier signal, indicating a resistive short, and further indicating that a binary zero is represented by the memory cell. When multiple memory cells are activated, the current or voltage across the memory cells is aggregated. Still, if all of the selected memory cells are set a resistive open state, then the sense amplifier signal may be weak, such that all memory cells represent a binary one value.

In the example of FIG. 2A, WL A4 and WL A3 are activated, which addresses memory cells ranging from BL A1-BL A16. Any of those memory cells set to a resistive short will produce a current or voltage signal that is sensed by the relevant sense amplifier 219. Here, BL A1 produces a signal to the sense amplifier SA 1 indicating a resistive short for at least one of the activated cells. FIG. 2A depicts this as an arrow at the top of BL A1 towards sense amplifier SA 1. Likewise, BL A2 produces a strong signal to the sense amplifier SA 2 indicating a resistive short for at least one of the activated cells. For example, the cell at WL A4 and BL A2 is set to a resistive short, thereby producing a strong signal. However, BL A4 produces a weak signal when WL A4 and WL A3 are activated. This indicates that the cell at WL A4 and BL A4 and the cell at WL A4 and BL A4 are set to a binary one, resistive open. No arrow is shown at the top of BL A4 into sense amplifier SA 4, as this is a weak signal. All cells set to a resistive open state conduct little to no current and/or have little to not voltage differential.

The first sequence shown in FIG. 2A may activate all bit lines BL A1-A16 in parallel or in series. Enablement of bit lines for activation can be done by sense amplifiers biasing a bit line to a certain bias level. When the first sequence is complete, the sense amplifiers 219 detected that no signal having a strong current or voltage was received at BL A4, BL A8, BL, A12, and BL, A16. This means that these bit lines 212 contain a partially matching pattern with respect to the input pattern 222. Specifically, each of these bit lines 212 contain respective patterns that have binary one's at the same location as the binary ones of the input pattern 222. FIG. 2B shows a second sequence that is used to complete the pattern matching operation by evaluating the binary zeros of the input pattern 222 with respect to the set of inverse patterns stored in the second portion 206.

In FIG. 2B, the word lines 215 corresponding to binary zero values of the input pattern 222 are activated by the controller 109. In this case, WL B1 and WL B2 are activated, as they map to the binary zero values of the input pattern 222. The bit lines 212 having resistive opens (e.g., binary ones) at WL B1 and WL B2 produce a signal having little to no current or voltage while all other bit lines 212 produce strong signals indicating a detected current or voltage. Here, WL B1 through BL B4 have cells set to binary ones. WL B5 through BL B16 have cells having at least one binary zero.

Upon completion of the first sequence (FIG. 2A) and the second sequence (FIG. 2B), sense amplifier SA 4 was the only sense amplifier 219 that detected the presence of resistive opens for both sequences. Therefore, the memory device 100 determined that the input pattern 222 has one match and that match is stored at BL A4. Also, the inverse of the pattern is stored at BL B4. This completes the pattern matching operation.

In some embodiments, each sense amplifier 219 may be activated or deactivated by the controller 109. After the first sequence of performing pattern matching in the first portion 203, the sense amplifiers 219 that did no detect a partial pattern (e.g., SA 1, SA 2, SA 3, SA 5, SA 6, SA 7, SA 9, SA 10, SA 11, SA 13, SA 14, SA 15). In other words, the bit lines 212 that contained one or more resistive shorts when WL A3 and WL A4 are activated produce a strong current or voltage signal indicating no partial match. The sense amplifiers 219 for these bit lines are deactivated and corresponding to deactivated sense amplifiers bit line connections from BL B set may be placed in high impedance state (or no bias state). Then, for the second sequence, only SA 4, SA 8, SA 13, and SA 16 are activated because they are coupled to bit lines 212 having a partial match.

In some embodiments, each pattern of the first set and each pattern of the second set are stored in a bit-serial orientation. In this respect, a single pattern may be stored along a single bit line 212. In some embodiments a match/search of a second pattern may be initiated on the BLs A while the first pattern is still matched/searched during the 2nd pass on BLs B. This may be referred to as pipelining.

FIGS. 2A and 2B show an example where the controller 109 is configured to apply the input pattern 222 by contemporaneously activating a plurality of word lines 215 of the first portion 203 or a plurality of word lines 215 of the second portion 206. For example, in the first sequence, a subset of the word lines WL A1-WL A4 may be contemporaneously activated. The subset is defined by the input pattern 222. For example, the word lines 215 corresponding to bit positions of the input pattern 222 having a binary one are contemporaneously activated. This allows for parallel processing to reduce processing time. Likewise, in the second sequence, a subset of the word lines WL B1-WL B4 may be contemporaneously activated, where the subset is defined by the values of the inverse of the input pattern 222.

In embodiments, where the memory device comprises ReRAM or other technology that modulates memory cell resistance or conductance to store data, the controller 109 detects short circuits or open circuits for performing pattern matching. As discussed in the examples of FIG. 2A and FIG. 2B, the controller 109 and sense amplifiers 219 work in conjunction to detect which bit lines 212 have memory cells that have open circuits and short circuits to perform pattern matching over the course of sequencing through word line activations. Moreover, between sequences of word line activations, the controller may deactivate some sense amplifiers 219 depending on whether short circuits or open circuits were detected. Alternatively, the sense amplifiers 219 themselves may have a feature to deactivate themselves after the first pass if a short circuit is detected and may be activated again by a common reset signal from the controller 109. This can filter down the bit lines 212 that are tested for pattern matching in subsequent sequences.

In some embodiments, the controller 109 is configured to apply the input pattern 222 in a plurality of pipeline stages by segmenting the input pattern 222 into a plurality of segments. For example, if the input pattern 222 is sixteen bits in length, the input pattern may be segmented into four four-bit segments that are matched against four-bit segments of stored patterns that are also sixteen bits long. However, the 16-bit pattern applied, as a whole, at once is also possible. The example of a 4-bit pattern is provided simply for exemplary reasons. Any bit long pattern is possible. Segments of the input pattern 222 may also vary in length as long as each input pattern segment is matched against equal size segments of patterns stored in the memory device 100. When segmenting the input pattern 222 and the stored patterns, each segment may be processed in series or in parallel. When processing each segment in series, the operation may be similar to the operation described above where the input pattern 222 is a segment of a larger input pattern 222. When processing each segment in parallel, each segment of the input pattern 222 may be processed in separate memory arrays 103 or separate arrays of sense amplifiers 219 or the same array of sense amplimers 219 but using more word lines matching the bit length of the pattern.

While FIGS. 2A and 2B provide one example of performing pattern matching, other variations are contemplated. For example, the input pattern 222 may be inversed. In the first sequence that tests the first portion 203 storing the set of patterns, the word lines 215 corresponding to binary zero values of the input pattern 222 (as inversed) are activated. In the second sequence that tests the second portion 206 storing the set of inversed patterns, the word lines 215 corresponding to binary one values of the input pattern 222 (as inversed) are activated. The sense amplifiers 219 that detected open circuits for both sequences would be storing the inverse of the input pattern 222.

The first sequence and second sequence may be performed contemporaneously or in series. If performed contemporaneously, the first portion 203 may include a memory array 103 that is different from the memory array 103 of the second portion 206. Thus, the set of patterns is stored in a first memory array 103 while the inverse patterns of the set of patterns is stored in a second memory 103. Both memory arrays may be tested contemporaneously. If performed in series, the set of patterns and the inverse patterns of the set of patterns may be stored in the same memory array 103, or potentially different memory arrays. In some embodiments, each sense amplifier 219 may have its own memory register for storing results of each sequence. In this respect, the results of whether a sense amplifier 219 detected an open or short circuit on a bit line may be stored in the memory register of the sense amplifier 219.

In some embodiments the first sequence and second sequence may be performed contemporaneously when both a pattern and its inverse pattern are stored on the same bit line but in different word line segments of the first portion 203 of a memory array 103 (e.g. one above the other). In this case both the input pattern 222 and its inverse are applied to respective word lines by activating the word lines that correspond to relevant bit values of the input pattern 222 and its inverse in the same manner as described above. In this case, both the input pattern 222 and its inverse are tested for a match contemporaneously and the result is obtained in a single step by parallel word line activation (without limiting since sequential world line activation is also possible).

In a similar way, several patterns and their inverses may be stored on the same bit line. Matching/searching several patterns at once as a group is desirable when it is needed to find information for a group. Common operations for this case are dataframe operations (such as Spark dataframe or Pandas dataframe or SQL database operations). The following are examples of high level operations that may be implemented used the embodiments described above: 'groupBy' operation, 'groupBy-Aggregate' operation, 'join by grouping criteria' operation, 'merge by grouping key' operation and so on.

In some embodiments, the input pattern 222 may comprise input data for a convolutional operation that may be part of a feature detection and building a feature map based on matching the input data with one or more convolutional filters. In this embodiment, the stored patterns may represent convolutional filters. In other embodiments, the input pattern 222 may comprise convolutional filters or be part of such for a convolutional operation that may be part of a feature detection and building a feature map based on matching the input pattern 222 with data stored in the memory device 100. In this embodiment, the stored patterns may represent data that is subject to feature detection via convolutional operations. Convolutional operations may be part of a CNN or Deep Neural Network (DNN). With technique described it is possible to do exact feature detection. An example of this is described with respect to FIG. 8.

In some embodiments, the second portion 206 may store the inverse patterns in response to a bit flip operation. A bit flip operation is applied to a memory array 103 (or at least a portion thereof) to invert each memory cell. Here, after the first sequence, a bit flip operation may be applied to invert each memory cell of the first portion to generate a second portion 206 that stores the inverse patterns. At least two cases are possible. In a first case, when bit inversion occurs in place (e.g. the first portion 203 becomes second portion 206 after applying inversion operation, where such inversion operation can be a bias of opposite polarity applied to the memory cells or different frequency or voltage or duty cycle which is used when applying the input pattern 222), then, the second sequence may be performed after the bit flip operation. In a second case, the second sequence may be performed during the bit flip operation as a part of this operation in cases when memory cell responds differently do different stimuli (e.g. diode memory cell or floating gate transistor memory cell). In this embodiment of using a bit flip operation, the first portion 203 and second portion 206 encompass the same physical memory cells, however, they store the values at different points in time. Thus, the controller 109 may be configured to invert the values of the first portion 203 prior to performing the second sequence. Some memory cells may be invertible (changing their value from 1 to 0 or 0 to 1 under presence of certain conditions (e.g. magnetic or electric field, polarity of applied voltage, certain voltage bias). Thus, it is possible, for example, to test for an inverse pattern by simply inverting polarity of applied voltage to the cells. For example, in the first sequence that tests bits with value '1', a first voltage bias is applied for all bits with that value in the pattern. In the second sequence, bits with value '0' bits are tested by applying a second voltage, possibly reversed or different than the first, for all bits with that value in the pattern. In some embodiments, instead of applying voltages, an electro-magnetic field may be applied to the memory array to invert the stored bits. The field can be emitted from a plate located above or below the portion of the memory array.

One example of a high-level application for pattern matching is performing a key-value pair search, which is based on a key search (main part) and locating an associated value. A key-value pair search involves receiving a key and looking up a value that corresponds to the key, hence a key-value pair. A key may be a relatively short sequence of numbers while the value may be lengthy. For example, a key may be a user name and the value may be a lengthy report associated with the user name. In some embodiments, key may be lengthy relative to the value. For example, a relatively lengthy student name may be the key and its associated grade may be a relatively short value. In some embodiments, the key may correspond to one or more values. In some embodiments, a key may not have any corresponding values. When implementing a key-value lookup, the input pattern 222 may be a key. The pattern matching operation identifies which bit lines 212 contain the key. The bit line(s) 212 that store the key may map to location of the value. The output of the pattern matching operation is the value associated with the bit line 212 that stores the key. For example, if the input pattern 222 represents a key, the memory device 100 determines that they key is stored on bit line BL A4. That is, this bit line 212 has a bit line identifier of BL A4 which maps to a portion in the memory device 100 (e.g., a particular memory array, a particular word line range, and/or a particular bit line range, etc.) that stores the value of the key-value association. Thus, the input is the input pattern 222 (e.g., a key) and the output is the value, which is stored at a memory location that is referenced by the bit line (e.g., BL A4) that stores the input pattern 222. In some embodiments the value may be stored on the same bit line above or below the key. In some embodiments, the bit line may store an index along with the value. The index can be accessed and refer to the location of the value. In some embodiments, the key or the associated index may refer to a location of a second part of the key or a second key, which in turn may refer to a third part of the key or a third key and so on, This may allow the implementation of hierarchical lookups and searches. Augmented with pipelining, such lookups are useful, for example, in cases of operating system (OS) page table walks, when an OS searches for page table entries during for example a page fault event. The key is matched, but the values can be stored anywhere as long as there is a mapping (e.g., a fixed scheme that defines where a value for each key may be located within the memory device 100). For example, a first memory array 103 can store keys and a second memory array 103 can store values at the same positions for each key. Also, key-value mappings can be diverse (e.g., one-to-one, onto, many to many). The patterns may represent graphs, data used in neural networks (e.g., filters search inputs etc.), maps, dictionaries, etc.

FIGS. 3A-D are drawings of a memory device configured to perform pattern matching by activating word lines in series according to various embodiments. FIGS. 3A-D show a controller 109 that is configured to apply an input pattern 222 to a portion of a memory array by sequentially activating a plurality of word lines of the portion of the memory array. The sequential activation of word lines allows for pattern matching without storing inverse patterns. This may reduce the amount of memory needed to store patterns, but it may increase the time it takes to perform the pattern matching operation. FIGS. 3A-D also show that for each sequential word line activation, each sense amplifier measures the flow of current or a voltage differential for the bit lines that are coupled respective sense amplifiers.

In FIG. 3A, a set of patterns is stored in a portion of the memory device 100. The portion may span one or more memory arrays. In this example, the portion spans bit lines 212 identified as BL A1 through BL A16. The portion also spans word lines 215 identified as WL A1 through WL A4. WL A1 represents the LSB of each pattern while WL A4 represents the MSB for each pattern. A respective sense amplifier 219 is coupled to a corresponding bit line 212. Unlike the examples of FIGS. 2A and 2B, there is no second portion that stores inverse patterns.

In FIG. 3A, an input pattern 222 is mapped to a range of word lines 215 so that each bit or element of the input pattern 222 maps to a corresponding word line 215. FIG. 3A shows a first word line activation (e.g., a first sequence), where WL A4 is activated. The controller may apply an activation signal to activate the word line 215. Memory cells containing a binary zero are set to a resistive short while memory cells containing a binary one are set to a resistive open. Each sense amplifier 219 detects the presence of an open or short circuit for the bit line 212 to which it is coupled. For example, BL A1 is set to resistive short in this word line activation sequence. This may produce a strong current or voltage signal that is detected by the sense amplifier SA 1. BL A2 is set to resistive open in this word line activation sequence. This may produce a weak current or voltage signal that is detected by the sense amplifier SA 2.

In some embodiments, each sense amplifier 219 may include a memory register or a latch to record whether it detected an open or short circuit. In other embodiments, a buffer memory of the memory device may record each sense amplifier's readings. The sense amplifier's reading is a reading of a flow of current or a voltage or a voltage differential. After the first word line activation is complete and the sense amplifiers 219 detect open or short circuits, the controller 109 may compare each sense amplifier 219 reading to the value position of the input pattern 222 corresponding to the activated word line. In this example, the value position for word line WL A4 is a binary one. The value position is the value at a particular bit or element position. In this example, the position is the MSB. The controller 109 selects those sense amplifiers 219 that detected the same value as the value position corresponding to the activated word like 215. In other words, in this example, the controller 109 selects sense amplifiers that detected an open circuit (which corresponds to a binary one). In some embodiments, the sense amplifiers may select themselves based on the latched value of the reading.

As shown in item 306, the sense amplifiers coupled to bit lines BL A2, BL A4, BL A6, BL A8, BL A10, BL A12, BL A14, and BL A16 are selected. This completes the first word line activation sequence. In some embodiments, the non-selected bit lines 212 are deactivated, as they are determined to not contain the same pattern as the input pattern based on the first word line activation sequence. In some embodiments, the sense amplifiers 219 may deactivate themselves based on the latched value of the reading. In some embodiments, the sense amplifiers 219 may be of a differential type, or of a comparator type. The controller 109 may send a common signal to all sense amplifiers 219, where the signal corresponds to the true value of a current bit to match. In the case of the first sequence, the signal would correspond to bit value '1', and consequently the sense amplifiers 219 may perform differential sensing or comparison based on this value received (common to all sense amplifiers). In some embodiments, the signal that the controller 109 sends may be generated based on the reference signal when biasing a reference memory cell that stores known true value '1' (as in the first sequence case or different value as in other cases) with the same word-line activation signal as the controller 109 drives the WL A4. Thus, each sense amplifier 219 can differentiate or compare its signal with a reference signal of a known true value of a memory cell.

Figure 3B:
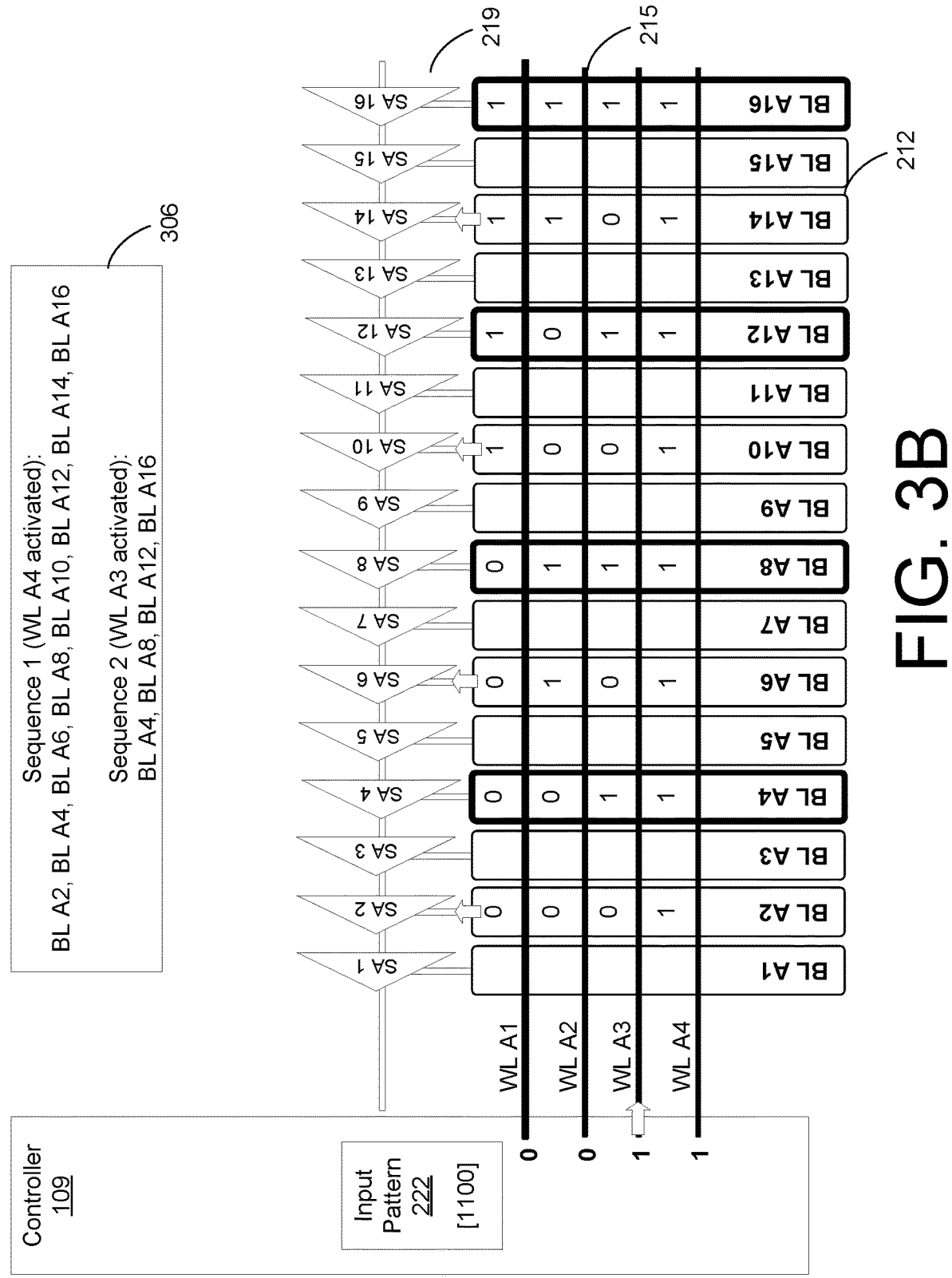

FIG. 3B shows a second word line activation sequence where WL A3 is activated. The controller 109 applies an activation signal on this word line and any activated sense amplifiers 219 detect whether their corresponding bit lines contain memory cells set to an open or short circuit. Then, the controller 109 compares each sense amplifier reading to the position value corresponding to the activated word line 215 (WL A3). Alternatively, each sense amplifier 219 compares its signal with a reference signal corresponding to value '1' and latches its signal as described above. In this case, the activated word line corresponds to a position value of a binary one. As shown in item 306, the controller 109 selects the sense amplifiers 219 coupled to bit lines BL A4, BL A8, BL A12, BL A16. In some embodiments, the sense amplifiers 219 may select themselves based on the latched value of the reading and its comparison with reference. These bit lines 212 contain a binary one along the activated word line 215. The remaining sense amplifiers 219 may be deactivated. In some embodiments, the sense amplifiers 219 may deactivate themselves based on the latched value of the reading and its comparison with reference.

Figure 3C:
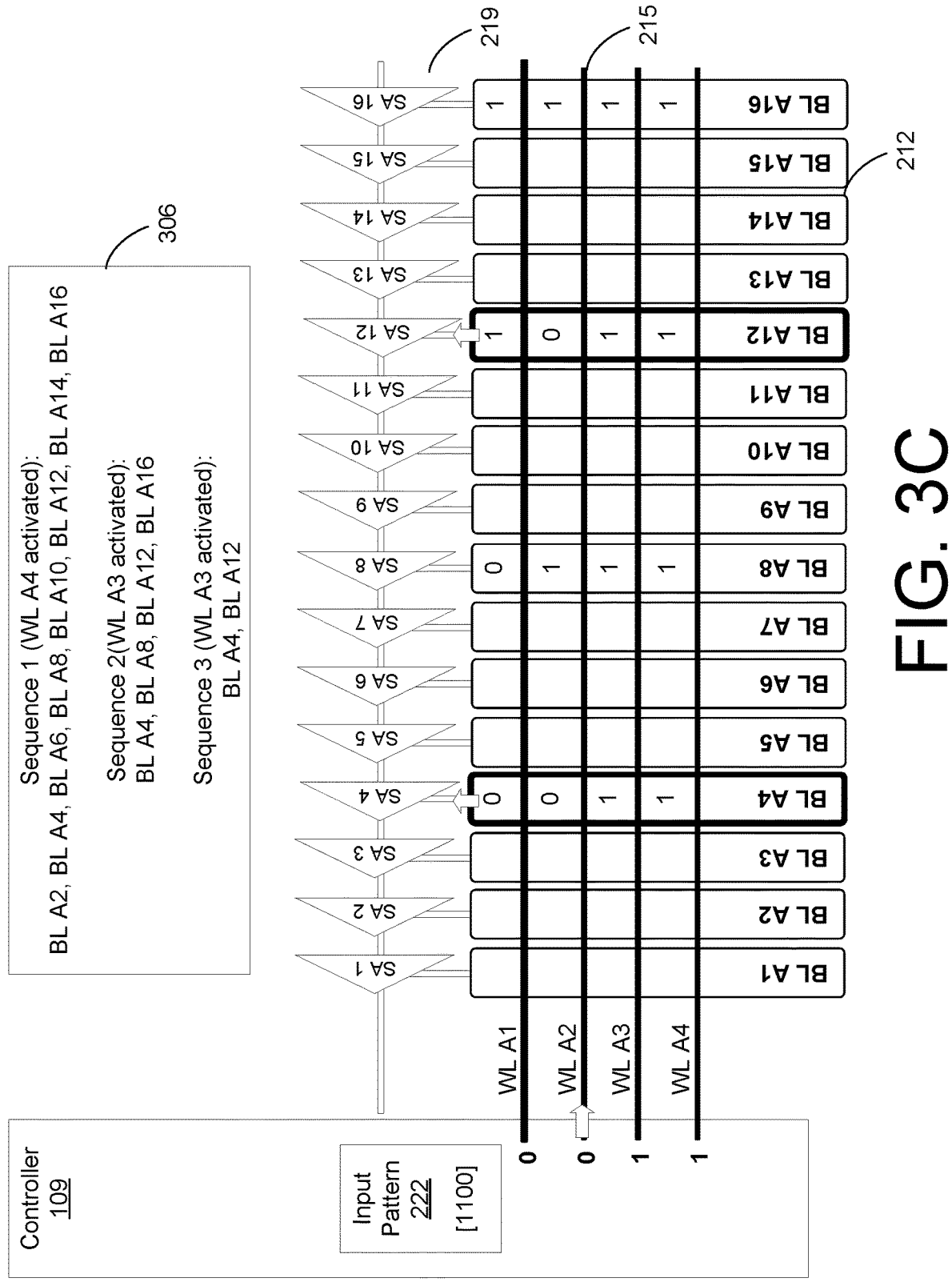

FIG. 3C shows a third word line activation sequence where WL A2 is activated. The controller 109 applies an activation signal on this word line and any activated sense amplifiers 219 detect whether their corresponding bit lines contain memory cells set to an open or short circuit. Then, the controller 109 compares each sense amplifier reading to the position value corresponding to the activated word line 215 (WL A2). Alternatively, each sense amplifier 219 compares its signal with a reference signal corresponding to value '0' and latches its signal as described above. In this case, the activated word line corresponds to a position value of a binary zero. As shown in item 306, the controller 109 selects the sense amplifiers 219 coupled to bit lines BL A4 and BL A12. In some embodiments, the sense amplifiers may select themselves based on the latched value of the reading and its comparison with reference. These bit lines 212 contain a binary zero along the activated word line 215.

The remaining sense amplifiers 219 may be deactivated. In some embodiments, the sense amplifiers 219 may deactivate themselves based on the latched value of the reading and its comparison with a reference.

Figure 3D:
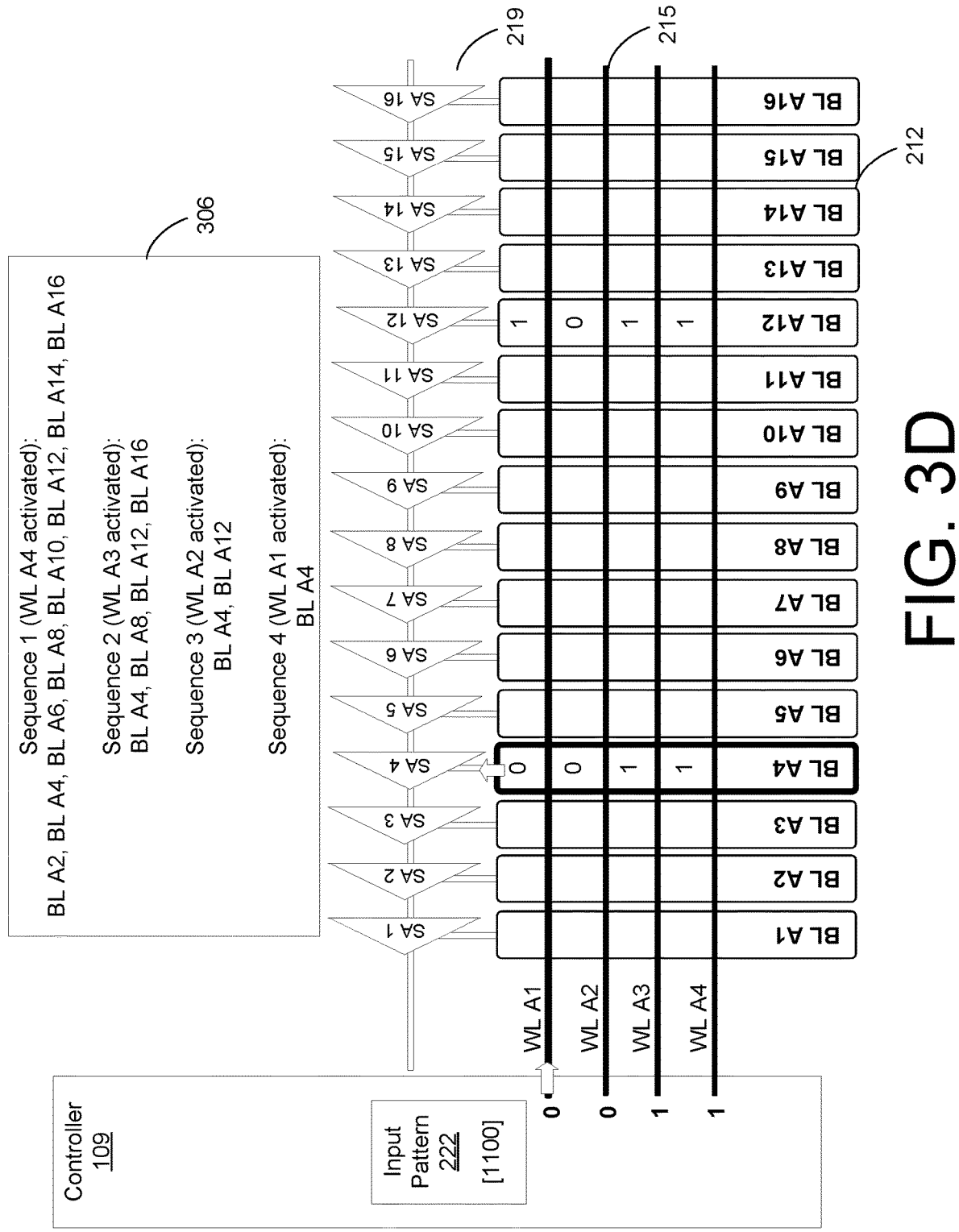

FIG. 3D shows a fourth word line activation sequence where WL A1 is activated. The controller 109 applies an activation signal on this word line and any activated sense amplifiers 219 detect whether their corresponding bit lines contain memory cells set to an open or short circuit. Then, the controller 109 compares each sense amplifier reading to the position value corresponding to the activated word line 215 (WL A1). Alternatively, each sense amplifier 219 compares its signal with a reference signal corresponding to value '0' and latches its signal as described above. In this case, the activated word line corresponds to a position value of a binary zero. As shown in item 306, the controller 109 selects the sense amplifiers 219 coupled to bit line BL A4. In some embodiments, the sense amplifiers 219 may select themselves based on the latched value of the reading and its comparison with a reference This bit lines 212 contains a binary zero along the activated word line 215.

After activating each word line, the remaining sense amplifier(s) is determined to be coupled to the bit line 212 containing the input pattern 222. In this case, BL A4, which is coupled to SA 4 contains a matching input pattern 222. Alternatively, the remaining sense amplifier(s) is determined to be containing 1-bit accumulated comparison value that passed all word line activation cycles: a binary AND of results of comparison in each cycle. In alternative embodiment, the amount of error can be recorded for each bit position. The amount of error or difference between the reference and stored value can be obtained by analog to digital conversion. Using this difference, it is also possible to do compare operations, and based on compare operations sorting operations can be performed in memory: sorting based on the relative amount of difference.

In some embodiments, the input pattern 222 may comprise input data for a convolutional operation that may be part of a feature detection and building a feature map based on matching the input data with one or more convolutional filters. In this embodiment, the stored patterns may represent convolutional filters. In other embodiments, the input pattern 222 may comprise convolutional filters or be part of such for a convolutional operation that may be part of a feature detection and building a feature map based on matching the input pattern 222 with data stored in the memory device 100. In this embodiment, the stored patterns may represent data that is subject to feature detection via convolutional operations. Convolutional operations may be part of a CNN or DNN. The amount of error can be used for determining the difference between the data and the feature encoded in a filter.

In addition, if detection is performed by sequential activation of word lines, each word line position can be used as a significance value. Using this technique, each data point is stored as a digit and the filter vector is also a digit. However, each digital datum is chunked on groups of bits from MSB to LSB mapped to word lines. Thus, a mismatch is quantized such that a group of bits closer to MSB has higher significance than a group that is closer to LSB. If the results from each group are accumulated in a sequential manner and weighted, then i a single output number is produced for each column, where the single output number signifies the amount of mismatch between the feature filter and the data.

While FIGS. 3A-3D show an example of an input pattern made up of binary values, the input pattern may include discrete values (e.g., quantized values) or analog values. In either case, the sense amplifier 219 may detect a current of voltage that corresponds to the activated memory cell's state. The detected current or voltage may be used to determine the value of the memory cell. In addition, the sequence of activating word lines can be performed in any predefined sequence such, for example, in a sequence from a top word line to bottom word line, a sequence from a bottom word line to a top word line, in odd word lines and then even word lines, or any other predefined sequence. This is described in more detail with respect to the remaining FIGS.

Figure 4:
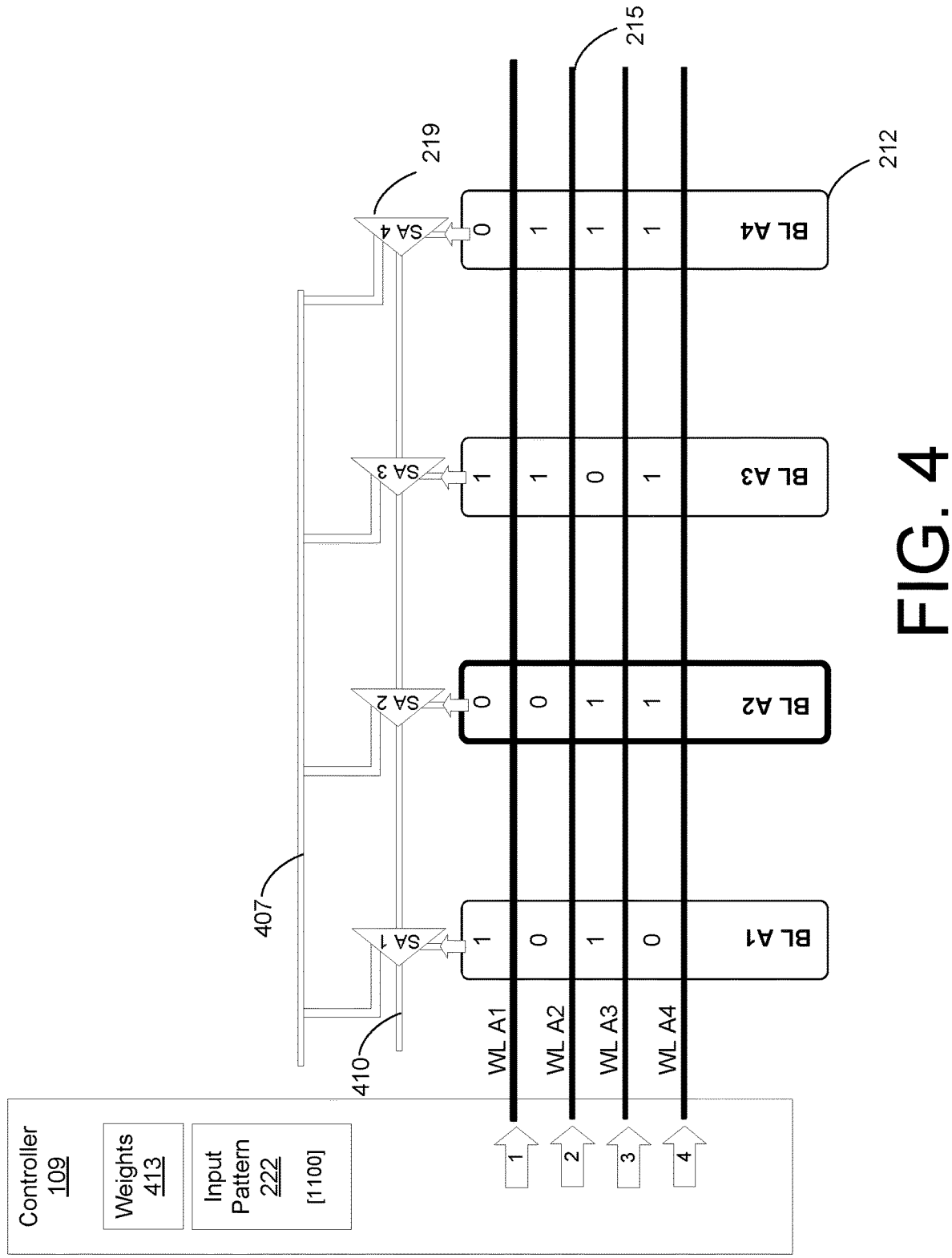
FIG. 4 is a drawing of a memory device configured to perform pattern matching using a reference current or voltage according to various embodiments.

FIG. 4 is a drawing of a memory device configured to perform pattern matching using a reference current or voltage in alternating current (AC) or direct current (DC) form according to various embodiments. Specifically, the example in FIG. 4 shows pattern detection without the use of an inverse pattern while also permitting activation of a plurality of word lines in parallel to increase speed. By activating multiple word lines in parallel (as opposed in a series of activations), multiple memory cells along each bit line are also activated. Thus, the current or voltage across each cell is combined along the bit line. Parallel word line activation makes it difficult for a sense amplifier 219 to detect a single cell's state. To address this, the bit line's current or voltage may be measured and compared to a reference current or voltage to determine the degree of match. This may be referred to as a fuzzy comparison.

To illustrate, FIG. 4 shows an input pattern 222 being [1, 1, 0, 0] ranging from MSB to LSB. This is mapped to a word line range starting with WL A4 as the MSB position and ending with WL A1 as the LSB position. Each of these word lines 215 may be activated in parallel such that the controller applies an activation signal to each of these word lines 215 at the same time. Bit lines BL A1 through BL A4 store different sets of patterns in a bit-serial orientation. For example, a first pattern is stored along BL A1, a second pattern is stored along BL A2, and so on. This is similar to the previously discussed FIGS.

Each sense amplifier 219 may include or may be coupled to a comparator circuit or differential amplifier circuit. The sense amplifier, and more specifically, the comparator, receives a reference signal 407. The reference signal is generated by the controller 109 and may be a current signal or voltage signal in AC or DC form. The reference signal is selected to represent the value when the input pattern is perfectly matched. The comparator of the sense amplifier 219 generates a differential signal 410 representing the difference between the reference signal and the sense amplifier reading. The sense amplifier reading is the current or voltage detected along the respective bit line 212 to which it is attached. Thus, when the differential signal 410 is zero, the comparator and its associated sense amplifier 219 and bit line are detected to have stored a pattern that is substantially the same as the input pattern. To implement a fuzzy match, a predetermined tolerance is applied to determine a substantially close match. For example, if the difference signal 410 is within a predefined range away from a zero difference, then a fuzzy match is detected. The fuzzy match is thus determined by determining the difference between the detected current flow or voltage differential of a bit line (and measured by a sense amplifier 219) and the differential signal 410. If that difference is within a predefined tolerance, a fuzzy match is detected. In some cases, the signal 410 is converted to digital form by each sense amplifier and latched in a local to sense amplifier register. In such cases a fuzzy match is quantified in a form of a digital difference between the reference and the stored pattern. In some cases the signal 410 from each sense amplifier can participate in a winner-take-all operation: that is the sense amplifier(s) with signal 410 having the least value are selected as matches. In some cases the controller 109 may provide a threshold or a range and select sense amplifiers and associated bit lines that meet certain threshold or a range criteria for signal 410 in its analog or digital form after the conversion. Thus, as shown in the example of FIG. 4, performing fuzzy matching not only identifies matches but also estimates the degree of difference between a mismatched pattern and the input pattern. In addition, the amount of error or difference between the reference and stored value can be obtained by analog to digital conversion. Using this difference, it is also possible to do compare operations, and based on compare operations sorting operations can be performed in memory: sorting based on the relative amount of difference.

In some embodiments, the input pattern 222 may comprise input data for a convolutional operation that may be part of a feature detection and building a feature map based on matching the input data with one or more convolutional filters. In this embodiment, the stored patterns may represent convolutional filters. In other embodiments, the input pattern 222 may comprise convolutional filters or be part of such for a convolutional operation that may be part of a feature detection and building a feature map based on matching the input pattern 222 with data stored in the memory device 100. In this embodiment, the stored patterns may represent data that is subject to feature detection via convolutional operations. Convolutional operations may be part of CNN or DNN.

Using this process, mixed signal convolution may be implemented. For example, each data point is stored as a digit and the filter vector is also a digit. Each filter bit is translated into the drive signal such that the significance (position) of each bit corresponds to the strength of the drive signal (least significant bit has a smaller drive strength and the most significant bits has a higher drive strength). Thus, any short (or mismatch) on a bit line may have a significance in terms of the passed signal through it. The larger the signal (in terms of voltage or current) the more the difference/mismatch is detected for the feature. The association 'weight <=> bit position' is encoded as a drive strength. Thus, by activating multiple word lines in parallel the encoding 'weight <=> bit position' by drive strength provides a parallel graded convolution.

The controller also applies weights 413 so that readings for the MSB of a pattern is weighted more than readings for the LSB of the pattern. For example, WL A4, which is mapped to the MSB of the input pattern 222, receives an activation signal that is weighted by a large weight 413 of four. The next bit position, which is mapped to WL A3, receives an activation signal that is weighted by a medium weight 413 of three. The next bit position, which is mapped to WL A2, receives an activation signal that is weighted by a relatively smaller weight 413 of two. The LSB, which is mapped to WL A1, receives an activation signal that is weighted by smallest weight 413 of one. Thus, the word line activation that corresponds to the most significant value position of a pattern is associated with a weight that is greater than a weight associated with a current or voltage reading for a word line activation that corresponds to the value position of a pattern that is lower in significance. This allows the MSB of a pattern to have more influence over the LSB of the pattern. In this respect, any bit of the pattern may have influence according to bit significance.

FIG. 4 shows how each world line is activated with a respective activation strength proportional to a corresponding position weight (e.g., the MSB is weighted more than the LSB). Each sense amplifier 219 is configured to measure the flow of current or voltage differential in a coupled bit line for activations of the plurality of word lines. For example, assuming that word lines WL A1 through WL A4 are activated such that the controller drives each word line 215 by a respective, weighted activation signal. Then, BL A1 (upon it being selected), will generate a particular current flow or voltage differential that is defined by the memory cell states. Each cell state may be set to a resistive short or resistive open state that is specified by the pattern it stores. The sense amplifier 219 coupled to this bit line 212 detects the total summed current or voltage along the bit line. The comparator compares the detected total summed current or voltage and compares it to the reference signal 407. As mentioned above, the reference signal is a current or voltage that has a current or voltage value that equals the current or voltage of a perfectly matched pattern. Such current or voltage value that equals the current or voltage of a perfectly matched pattern can be obtained by driving word lines of a reference bit line that stores the reference value that matches the pattern value. Such a reference bit line can be a reference register as a part of controller 109.

In the example of FIG. 4, SA 2, which is coupled to BL A2, would generate a current or voltage that closely matches the reference signal, as it stores a pattern that matches the input pattern 222. The difference signal 410 for SA 2 would be zero or near zero.

Figure 5:
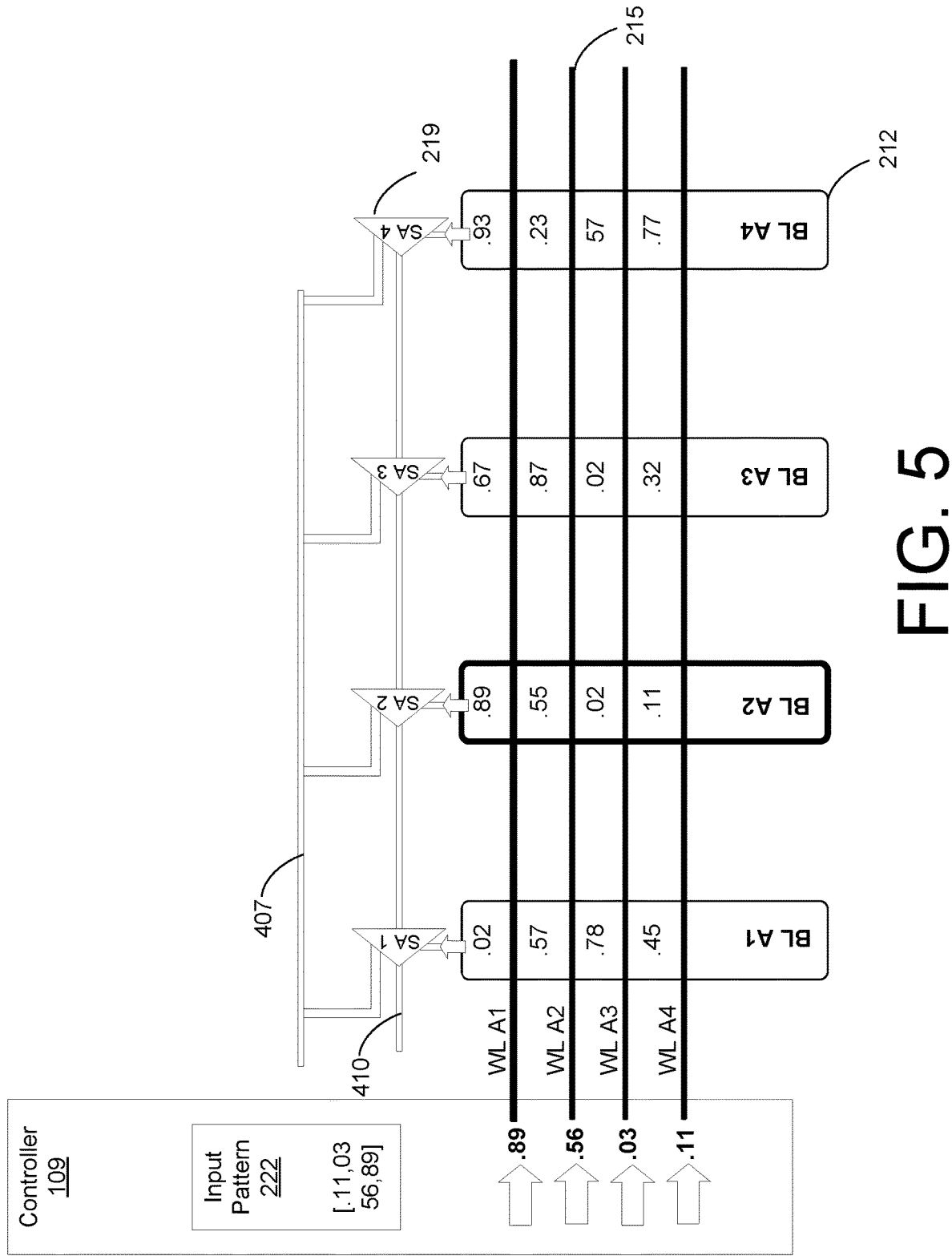
FIG. 5 is a drawing of a memory device configured to perform fuzzy matching of analog values according to various embodiments.

FIG. 5 is a drawing of a memory device configured to perform fuzzy matching of analog values according to various embodiments. Each element of the input pattern 222 may be an analog value, which may be generated by conversion digital value to analog value by digital to analog converters (DACs), which may be part of the drivers that activate word lines. In addition, the patterns stored in the memory device 100 may also include analog values at each memory cell. For example, to store an analog value in a memory cell, the memory cell is not fully programmed (e.g., a clean resistive short or a clean resistive open) but rather set to some state in-between these states with a certain resistance or conductance value. Here, the strength of sensed signal is used as determination of the strength of a partial match. This may have application in neural networks of fuzzy logic. As shown in the example of FIG. 5, performing fuzzy matching not only identifies matches but also estimates the degree of difference between a mismatched pattern and the input pattern.

To provide an overview, the controller 109 may drive each word line 215 by applying an activation signal proportionally to the value of the input pattern at a corresponding position (e.g., the value position). Assume that one of the bit lines in the memory array 103 stores a target pattern that nearly matches the input pattern 222 (BL A2 in FIG. 5). Here, this bit line provides a current or voltage at a particular value that is sensed by the sense amplifier 219. A comparator of the sense amplifier compares the bit line current or voltage to a reference signal 407. This generates a difference signal 410. The difference signal represents the degree of match as explained in the example of FIG. 4. The closer the difference signal is to zero (e.g., zero difference between the reference signal 407 and the current or voltage on the bit line), the closer the match.

In addition, in FIG. 5, each world line 215 is activated with a respective activation strength proportional to a corresponding value position of the input pattern. Thus, rather than accounting for the bit position within the input pattern, the activation signal is based on each value of a pattern.

To elaborate, FIG. 5 shows an input pattern 222 as follows: [0.11, 0.03, 0.56, 0.89]. The first value is 0.11 while the last value is 0.89. Each word line 215 is driven by an activation signal that has a strength corresponding to these values. For example, WL A1 is driven by the controller 109 according to an activation signal proportional to 0.89 while WL A4 is driven by the controller 109 according to an activation signal proportional to 0.11. Here bit line BL A2, when activated by word lines WL A1 through WL A4, produce a voltage or current signal that is sensed by SA 2, which is a closest match to the reference signal 407. Although it might not be exactly the same as the reference signal 407, the voltage or current signal along bit line BL A2, is a fuzzy match if it is within a predefined tolerance of the reference signal 407. In addition, the amount of error or difference between the reference and stored value can be obtained by analog to digital conversion. Using this difference, it is also possible to do compare operations, and based on compare operations sorting operations can be performed in memory. The sorting may be based on the relative amount of difference.

In some embodiments the input pattern 222 may comprise input data for a convolutional operation that may be part of a feature detection and building a feature map based on matching the input data with one or more convolutional filters. In this embodiment, the stored patterns may represent convolutional filters. In other embodiments, the input pattern 222 may comprise convolutional filters or be part of such for a convolutional operation that may be part of a feature detection and building a feature map based on matching the input pattern 222 with data stored in the memory device 100. In this embodiment, the stored patterns may represent data that is subject to feature detection via convolutional operations. Convolutional operations may be part of a CNN or DNN.

Some embodiments include analog convolutional operations. In this embodiment, each data point is stored as analog resistance or conductance that corresponds to the strength of the number it represents (e.g. higher number stronger resistance). The original digital data can be stored elsewhere in another array such that mapping each digit in the original data to each resistance in the analog data is known. The controller 109 drives the current/voltage on each word line proportionally to the value of a number from the filter (e.g. higher number stronger drive). One of the columns in the array or special analog register stores a reference pattern that exactly matches filter pattern. Thus, reference column provides reference current or voltage. Each sense amplifier 219 in the array has a differential sensing that compares the current/voltage on its corresponding bit line to the reference. The difference of sensed value represents the degree of match: less difference means a stronger match.

In some embodiments, a single analog value may be segmented into an input pattern at varying positions. For example, the analog number "0.11035689" may be converted into an input pattern 222 that is four elements long: "[0.11,03 56,89]". This allows for pattern matching of single by large analog values.

Figure 6:
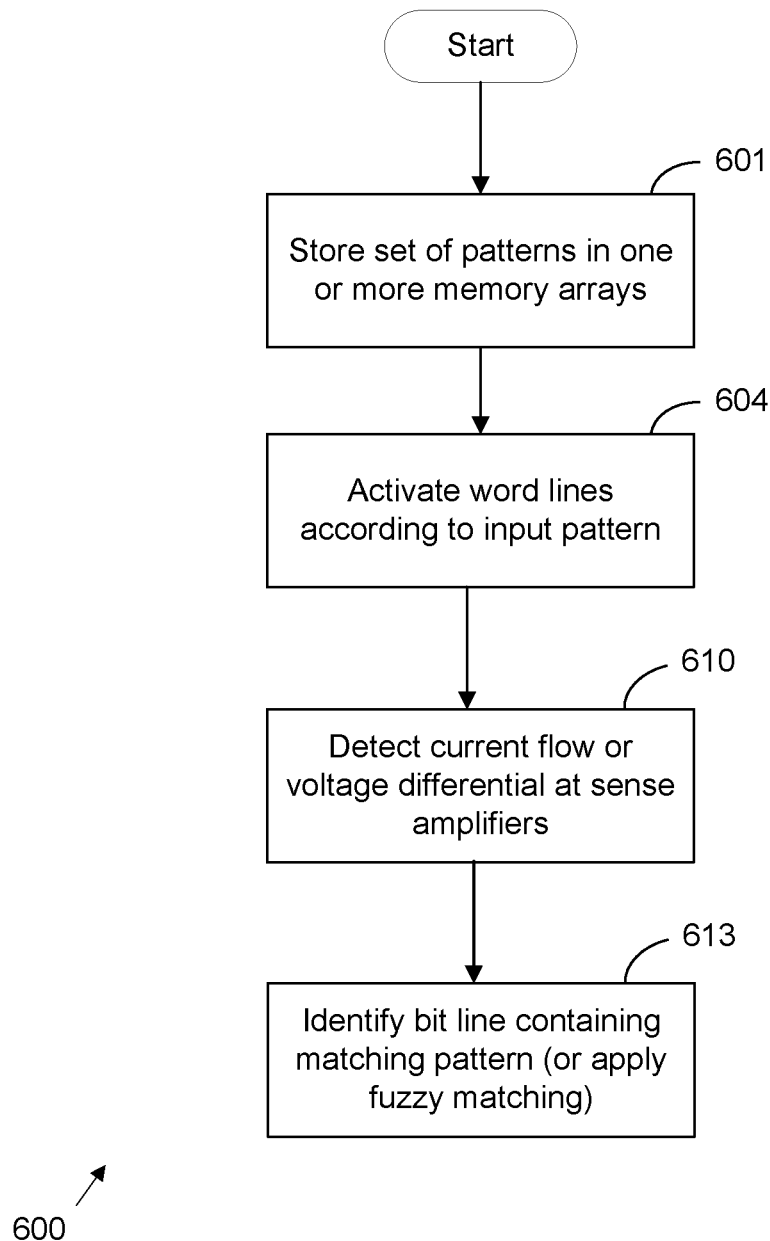
FIG. 6 is a flowchart illustrating varying examples of the performing pattern matching in a memory device according to various embodiments.

FIG. 6 is a flowchart illustrating varying examples of the functionality of a memory device 100 according to various embodiments. The boxes in the flowchart may represent microcode, machine code, firmware, or other software executable by the controller 109 or other logic in the memory device 100. The boxes of the flowchart may alternatively represent steps in a method 600. The method may be performed by a memory device 100.

At 601, the memory device 100 stores a set of patterns in one or more memory arrays. In some embodiments, the memory device stores a second set of inverse patterns, each of which correspond to patterns in the set of patterns. The set of patterns may be stored in a bit-serial orientation where each bit line couples to a sense amplifier. In this respect, each pattern may be store with respect to a dedicated sense amplifier. Moreover, each position within the stored patterns corresponds to a word line that may be activated by the controller.

At 604, the memory device 100 may activate word lines according to an input pattern. The input pattern may have values at different positions such that the input pattern is a series of position values. Each position value corresponds to a different word line that may be activated by the controller 109. Depending on the embodiment, word lines may be selected in parallel or in series. Multiple word lines may be selected as part of a sequence of different word line activations. In addition, the bit lines may be selected in parallel or in series. In some embodiments, the activation signal driving the word line is based on the input pattern position that is mapped to the word line. In other embodiments, the activation signal driving the word line is based on the value position, which is the value at the position that is mapped to the word line.

At 610, the memory device 100 detects a current flow or voltage differential at the sense amplifiers. In this respect, each sense amplifier reads the current or voltage at the bit line to which it is coupled. This bit line current or voltage is defined by the memory cell states (e.g., resistive short, resistive open, or intermediate resistance).

At 613, the memory device 100 identifies a bit line(s) containing the matching pattern. For example, if word lines are activated in series according to a sequence, the controller 109 may identify which bit line(s) contain the matching pattern by detecting whether the current or voltage across each individual memory cell of each bit line matches a value that corresponds to the input pattern at the corresponding position. If the word lines are activated in parallel, then the controller 109 may compare the current or voltage sensed at each bit line matches a reference signal. In embodiments that accommodate fuzzy matching, the controller 109 measures the degree that a bit line current or voltage matches a reference signal. If the degree of mismatch is within a predetermined tolerance or range, then a fuzzy match is determined. For example, the fuzzy match operation may result in a fuzzy match when a correspondence between the target pattern and the input pattern is greater than a threshold and less than a complete match of bits of the pattern. For example, the fuzzy match accounts for a tolerance or threshold current/voltage to deviate away from a complete match reading.

Although the flowchart shows a specific order of execution, it is understood that the order of execution may differ from that which is depicted. For example, the order of execution of two or more boxes may be scrambled relative to the order shown. Also, two or more boxes shown in succession may be executed concurrently or with partial concurrence. Further, in some embodiments, one or more of the boxes may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

The components carrying out the operations of the flowchart may also comprise software or code that can be embodied in any non-transitory computer-readable medium for use by or in connection with an instruction execution system such as, for example, a processor in a computing system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

Figure 7:
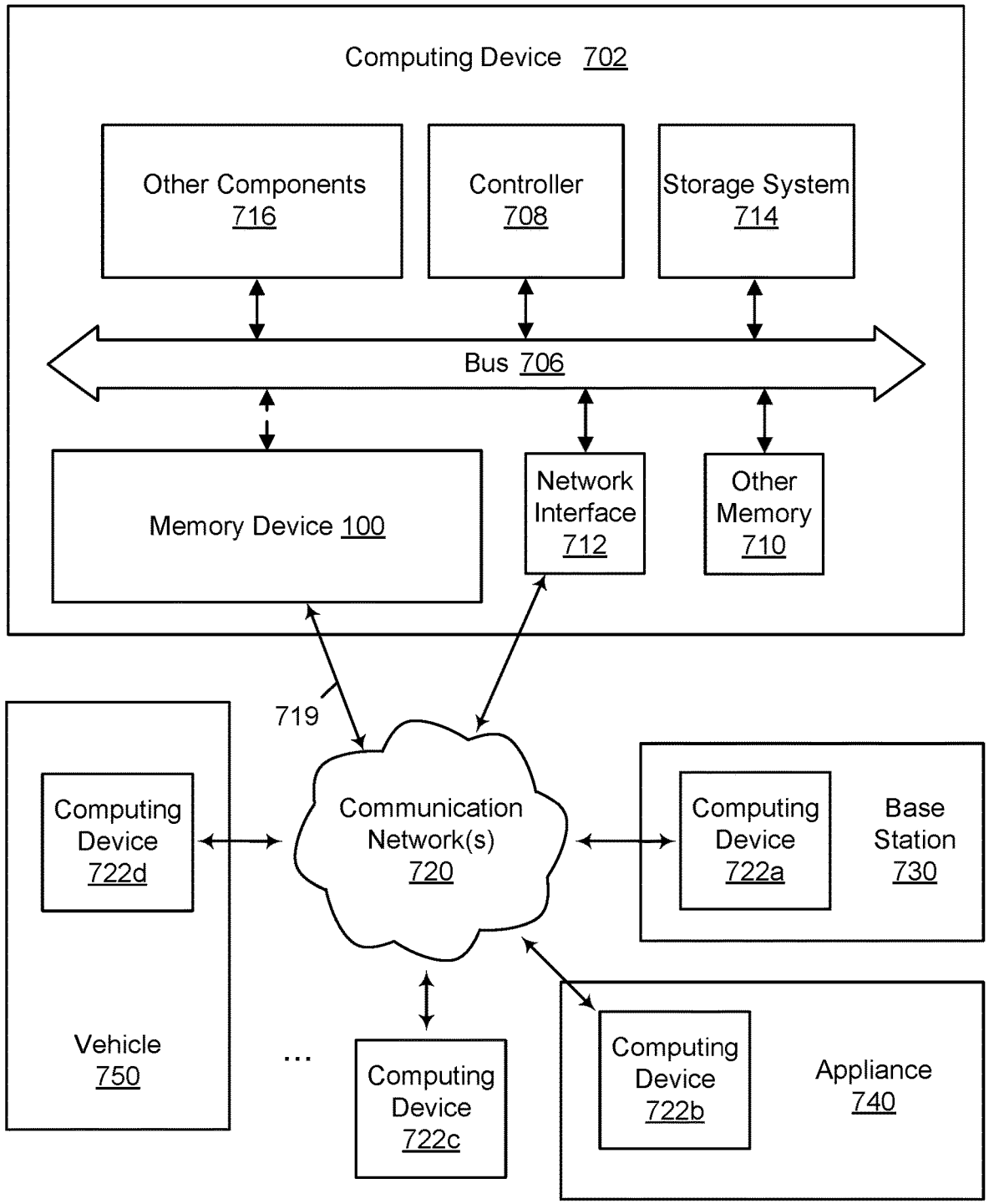
FIG. 7 illustrates an example of a networked system that includes a memory device, in accordance with some embodiments of the present disclosure.

FIG. 7 illustrates an example networked system 700 that includes a memory device 100, in accordance with some embodiments of the present disclosure. FIG. 7 illustrates example parts of an example of a computing device 702 with is part of the networked system 700. FIG. 7 shows how such computing devices can be integrated into various machines, apparatuses, and systems, such as IoT (Internet of Things) devices, mobile devices, communication network devices and apparatuses (e.g., see base station 730), appliances (e.g., see appliance 740), and vehicles (e.g., see vehicle 750).

The computing device 702 and other computing devices of the networked system 700 (e.g., see computing devices 722a, 722b, 722c, and 722d) can be communicatively coupled to one or more communication networks 720. The computing device 702 includes, for example, a bus 706, a controller 708 (e.g., a CPU), other memory 710, a network interface 712, a storage system 714, other components 716 (e.g., any type of components found in mobile or computing devices, GPS components, Input/Output (I/O) components such various types of user interface components, sensors, a camera, etc.), and a memory device 100. The other components 716 may also include one or more user interfaces (e.g., GUIs, auditory user interfaces, tactile user interfaces, etc.), displays, different types of sensors, tactile, audio and/or visual input/output devices, additional application-specific memory, one or more additional controllers (e.g., GPU), or any combination thereof. The bus 706 communicatively couples the controller 708, the other memory 710, the network interface 712, the data storage system 714 and the other components 716, and can couple such components to the memory device 100 in some embodiments. For example, a system link 115 of the memory device 100 may couple to the bus 706.

The computing device 702 includes a computer system that includes at least controller 708, other memory 710 (e.g., random access memory (RAM), read-only memory (ROM), flash memory, dynamic random-access memory (DRAM) such as synchronous DRAM (SDRAM) or Rambus DRAM (RDRAM), static random-access memory (SRAM), cross-point or cross-bar memory, crossbar memory, etc.), the memory device 100, and data storage system 714, which may communicate with each other via bus 706 (which can include multiple buses). In some embodiments, the memory device 100 may not communicate over bus 706.

To put it another way, FIG. 7 includes a block diagram of computing device 702 that has a computer system in which embodiments of the present disclosure can operate. In some embodiments, the computer system can include a set of instructions, for causing a machine to perform at least part any one or more of the methodologies discussed herein, when executed. In such embodiments, the machine can be connected (e.g., networked via network interface 712) to other machines in a Local Area Network (LAN), an intranet, an extranet, and/or the Internet (e.g., see network(s) 720).

The machine can operate in the capacity of a server or a client machine in client-server network environment, as a peer machine in a peer-to-peer (or distributed) network environment, or as a server or a client machine in a cloud computing infrastructure or environment.

Controller 708 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, single instruction multiple data (SIMD), multiple instructions multiple data (MIMD), or a processor implementing other instruction sets, or processors implementing a combination of instruction sets. Controller 708 can also be one or more special-purpose processing devices such as an ASIC, a programmable logic such as an FPGA, a digital signal processor (DSP), network processor, or the like. Controller 708 is configured to execute instructions for performing the operations and steps discussed herein. Controller 708 can further include a network interface device such as network interface 712 to communicate over one or more communication networks (such as network(s) 720).

The data storage system 714 can include a machine-readable storage medium (also known as a computer-readable medium) on which is stored one or more sets of instructions or software embodying any one or more of the methodologies or functions described herein. The data storage system 714 can have execution capabilities such as it can at least partly execute instructions residing in the data storage system. The instructions can also reside, completely or at least partially, within at least one of the other memory 710 and the memory device 100 and/or within the controller 708 during execution thereof by the computer system, at least one of the other memory 710 and the memory device 100 as well as the controller 708 also constituting machine-readable storage media. The other memory 710 can be or include main memory or system memory of the computing device 702. The other memory 710 and the memory device 100 can have execution capabilities such as it can at least partly execute instructions residing in any memory of the computing device 702.

As mentioned, the networked system 700 includes computing devices, and each of the computing devices can include one or more buses, a controller, a memory, a network interface, a storage system, and other components. Also, each of the computing devices shown in FIG. 7 and described herein can include or be a part of a mobile device or the like, e.g., a smartphone, tablet computer, IoT device, smart television, smart watch, glasses or other smart household appliance, in-vehicle information system, wearable smart device, game console, PC, digital camera, or any combination thereof. As shown, the computing devices can be connected to network(s) 720 that includes at least a local to device network such as Bluetooth or the like, a wide area network (WAN), a local area network (LAN), an intranet, a mobile wireless network such as 4G or 5G, an extranet, the Internet, and/or any combination thereof. In some embodiments, as shown with the connection 719, the memory device 100 can include at least one network interface so that it can communicate separately with other devices via communication network(s) 720. For example, the system link 115 may couple to the communication network 720. In this respect, a memory module or a memory module system of the memory device 100 may have its own network interface so that such a component can communicate separately with other devices via communication network(s) 720.

Each of the computing devices described herein can be or be replaced by a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine.

Also, while a single machine is illustrated for the computing device 702 shown in FIG. 7, the term "machine" shall also be taken to include any collection of machines that individually or jointly execute a set (or multiple sets) of instructions to perform one or more of the methodologies or operations discussed herein. And, each of the illustrated computing devices as well as computing systems can each include at least a bus and/or motherboard, one or more controllers (such as one or more CPUs), a main memory that can include temporary data storage, at least one type of network interface, a storage system that can include permanent data storage, and/or any combination thereof. In some multi-device embodiments, one device can complete some parts of the methods described herein, then send the result of completion over a network to another device such that another device can continue with other steps of the methods described herein.

While the memory, controller, and data storage parts are shown in the example embodiment to each be a single part, each part should be taken to include a single part or multiple parts that can store the instructions and perform their respective operations. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Figure 8:
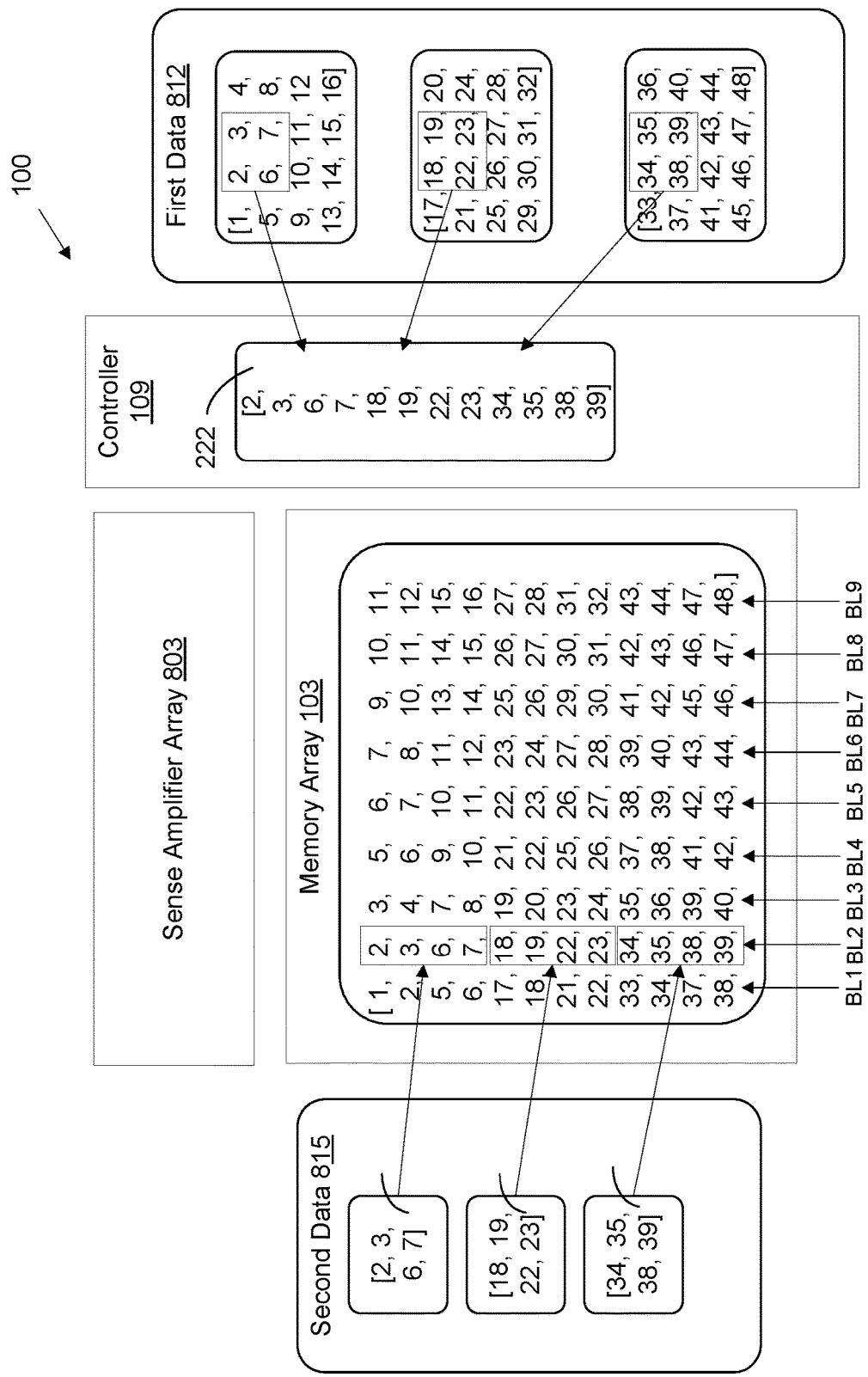
FIG. 8 illustrates an example of a convolutional operation that may be performed in accordance with some embodiments of the present disclosure.

FIG. 8 illustrates an example of a convolutional operation that may be performed in accordance with some embodiments of the present disclosure. FIG. 8 illustrates how a bit line is matched as part of a convolutional operation. In some embodiments, the input pattern 222 may comprise input data for a convolutional operation that may be part of a feature detection and building a feature map based on matching the input data with one or more convolutional filters. The convolutional operation may be used to detect whether a particular feature is present in a data object (e.g., an image). For example, the feature may be a horizontal edge, a vertical edge, a particular shape, a particular color pattern, a line, etc. The feature may be represented as a matrix or array of filter values.

For example, FIG. 8 shows a convolutional operation where first data 812 is applied to second data 815. Rather than performing multiplication operations (e.g., accumulating dot product multiplication results), the convolutional operation is performed by using a fuzzy match and search operation by detecting voltage or currents by a sense amplifier array 803 made up of sense amplifiers 219.

The first data 812 may be used to generate the input pattern while the second data 815 is used to generate a set of patterns to be matched against the input pattern 222. The sets of patterns may be arranged where each pattern in the set is stored along a respective column or bit line. The first data 812 may represent the values of a convolutional filter (e.g., a feature). For example, the first data 812 may include one or more matrices, where different values in the one or more matrices are selected as the input pattern 222. In addition, the second data 815 may include one or more matrices that represent one or more data object that are be analyzed with respect to the feature.

In other embodiments, the first data 812 may represent at least a portion of a data object that is be analyzed with respect to the feature while the second data 815 may represent values of one or more convolutional filters.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A system comprising:
a first portion of at least one memory array of a memory device configured to store a first set of patterns;
a second portion of the at least one memory array configured to store a second set of patterns, the patterns of the second set being inverted with respect to the patterns of the first set;
an array of sense amplifiers, each sense amplifier in the array couplable to the first portion of the at least one memory array and the second portion of the at least one memory array; and
a controller configured to apply an input pattern to the first portion of the at least one memory array and the second portion of the memory device;
the array of sense amplifiers being configured to identify a bit line that stores a pattern that substantially matches the input pattern in the first portion of the at least one memory array or in the second portion of the at least one memory array,
wherein the identified portion of bit line corresponds to a key, wherein the input pattern corresponds to a key, wherein the at least one memory array stores a plurality of values of key-value associations.

2. The system of claim 1, wherein the memory device is configured to store each pattern of the first set and each pattern of the second set in a bit-serial orientation.

3. The system of claim 1, wherein the controller is configured to apply the input pattern by contemporaneously activating a plurality of word lines of the first portion of the at least one memory array or the plurality of word lines of the second portion of the at least one memory array.

4. The system of claim 1, wherein the memory device comprises a Resistive Random Access Memory (ReRAM) device, wherein the array of sense amplifiers is configured to identify the portion of bit line by detecting short circuits or open circuits within the first portion of the at least one memory array and the second portion of the at least one memory array.

5. The system of claim 4, wherein the array of sense amplifiers is configured to identify the portion of bit line by deactivating sense amplifiers within the array of sense amplifiers in response to detecting short circuits or in response to detecting open circuits.

6. The system of claim 1, wherein the controller is configured to apply the input pattern in a plurality of pipeline stages by segmenting the input pattern into a plurality of segments.

7. A system comprising:
a portion of at least one memory array of a memory device configured to store a set of patterns;
an array of sense amplifiers, each sense amplifier in the array couplable to at least one bit line, the bit line is at least partly in the portion of the at least one memory array; and
a controller configured to apply an input pattern to at least one word line of the portion of the at least one memory array by segmenting the input pattern into a plurality of segments and applying the plurality of segments in a plurality of pipeline stages;
the array of sense amplifiers being configured to identify a bit line in the portion of the at least one memory array that stores the input pattern by detecting a flow of current or a voltage differential.

8. The system of claim 7, wherein each pattern in the set of patterns and each pattern comprises discrete values.

9. The system of claim 7, wherein each pattern in the set of patterns comprises analog values defined by a corresponding level of resistance.

10. The system of claim 7, wherein the identified portion of bit line corresponds to a key, wherein the input pattern corresponds to a key, wherein the at least one memory array stores a plurality of values of key-value associations.

11. The system of claim 7, wherein the controller is configured to apply the input pattern to the portion of the at least one memory array by, at least in part, sequentially activating a plurality of word lines of the portion of the at least one memory array, wherein each sense amplifier of the sense amplifier array is configured to measure the flow of current or voltage differential in a coupled bit line for each activation of the word lines.

12. The system of claim 11, wherein a current or voltage reading for a word line activation that corresponds to the most significant value position of a pattern is associated with a weight that is greater than the weight associated with a current or voltage reading for a word line activation that corresponds to the least significant value position of a pattern.

13. The system of claim 7, wherein the controller is configured to apply the input pattern comprising a plurality of values to the portion of the at least one memory array by activating a plurality of word lines of the portion of the at least one memory array, wherein each word line is activated with a respective activation strength proportional to a corresponding value position of the input pattern, wherein each sense amplifier of the sense amplifier array is configured to measure the flow of current in a coupled bit line for activations of the plurality of word lines.

14. The system of claim 7, wherein the controller is configured to apply the input pattern comprising a plurality of values to the portion of the at least one memory array by activating a plurality of word lines of the portion of the at least one memory array, wherein each word line is activated with a respective activation strength proportional to corresponding value or position of the input pattern, wherein each sense amplifier of the sense amplifier array is configured to measure the flow of current in a coupled bit line for activations of the plurality of word lines and further configured to compare the flow of current with a reference flow of current corresponding to values of input pattern for the plurality of activations of the word lines.

15. The system of claim 7, wherein the controller is configured to invert the values of the portion of the at least one memory array prior to identifying the portion of the bit line in the portion of the at least one memory array that stores the input pattern.

16. A method comprising:
   storing a set of patterns in a portion of at least one memory array of a memory device, each pattern being stored in a bit-serial orientation;
   activating a plurality of word lines of the portion of the at least one memory array according to an input pattern;
   detecting a current flow or voltage differential by an array of sense amplifiers, each sense amplifier in the array of sense amplifiers couplable to at least one respective bit line in the at least one memory array;
   identifying a matching bit line in the at least one memory array, the matching bit line storing a target pattern that matches the input pattern,
   wherein the identified bit line corresponds to a key, wherein the input pattern corresponds to a key, wherein the at least one memory array stores a plurality of values of key-value associations.

17. The method of claim 16, wherein each pattern in the set of patterns and each pattern comprises discrete values.

18. The method of claim 16, wherein identifying the matching bit line in the at least one memory array, comprises a first sequence and a second sequence, wherein a controller or the sense amplifiers perform the identifying, wherein the controller or the sense amplifiers are configured to disable the identifying in response to not identifying the matching bit line in the first sequence.

19. The method of claim 16, wherein the target pattern matches the input pattern according to a fuzzy match in which a correspondence between the target pattern and the input pattern is greater than a threshold and less than a complete match of bits of the pattern.

20. The method of claim 19, wherein the fuzzy match is determined by determining the difference between the detected current flow or voltage differential with a reference current or voltage.

21. The method of claim 16, wherein each word line is activated with a respective activation strength proportional to at least one of a corresponding value, the word line's position relative to other values, or a weight of the word line position, wherein each sense amplifier of the sense amplifier array is configured to measure the flow of current or voltage differential in a coupled bit line for activations of the plurality of word lines.

22. The method of claim 16, wherein the matching bit line is matched as part of a convolutional operation, wherein at least one of the input pattern or the set of patterns represent a convolutional filter.

* * * * *